US010325973B2

(12) United States Patent
Motoyama et al.

(10) Patent No.: US 10,325,973 B2
(45) Date of Patent: Jun. 18, 2019

(54) DISPLAY UNIT AND ELECTRONIC APPARATUS

(71) Applicant: Sony Corporation, Tokyo (JP)

(72) Inventors: Yosuke Motoyama, Kanagawa (JP); Reo Asaki, Tokyo (JP)

(73) Assignee: Sony Corporation, Tokyo (JP)

( * ) Notice: Subject to any disclaimer, the term of this patent is extended or adjusted under 35 U.S.C. 154(b) by 2 days.

(21) Appl. No.: 15/646,608

(22) Filed: Jul. 11, 2017

(65) Prior Publication Data

US 2017/0373127 A1 Dec. 28, 2017

Related U.S. Application Data

(63) Continuation of application No. 15/096,976, filed on Apr. 12, 2016, now Pat. No. 9,711,584, which is a continuation of application No. 14/408,054, filed as application No. PCT/JP2013/005382 on Sep. 11, 2013, now Pat. No. 9,343,516.

(30) Foreign Application Priority Data

Sep. 26, 2012 (JP) ................................. 2012-211861

(51) Int. Cl.
*H01L 27/32* (2006.01)
*H01L 51/52* (2006.01)

(52) U.S. Cl.
CPC ........ *H01L 27/3272* (2013.01); *H01L 27/322* (2013.01); *H01L 27/3211* (2013.01); *H01L 27/3213* (2013.01); *H01L 27/3216* (2013.01); *H01L 27/3218* (2013.01); *H01L 51/5265* (2013.01); *H01L 51/5284* (2013.01)

(58) Field of Classification Search
CPC ............ G02F 1/1323; G02F 1/133512; G02F 1/133514; G02F 1/136209; H01L 27/326; H01L 27/3218; H01L 27/3216; H01L 27/322; H01L 27/3272; H01L 27/3211; H01L 51/5284; H01L 27/3213
See application file for complete search history.

(56) References Cited

U.S. PATENT DOCUMENTS 7,990,058 B2   8/2011   Cok
9,910,265 B1 *  3/2018  Boon ..................... G02B 5/201
2002/0057253 A1  5/2002  Lim et al.
(Continued)

FOREIGN PATENT DOCUMENTS

JP   2005293946   10/2005
JP   2006-073219   3/2006
(Continued)

OTHER PUBLICATIONS

Japanese Office Action dated Feb. 16, 2016 in corresponding Japanese Application No. 2012211861.
(Continued)

*Primary Examiner* — Joseph C. Nicely
(74) *Attorney, Agent, or Firm* — K&L Gates LLP

(57) ABSTRACT

A display unit includes a light emitting layer including a light emitting device; a color filter layer including a color filter corresponding to the light emitting device; and a light blocking layer including a light blocking member arranged to overlap an end of the color filter, a center position of the light blocking member being offset from the end of the color filter.

9 Claims, 16 Drawing Sheets

(56) References Cited

U.S. PATENT DOCUMENTS

| | | | |
|---|---|---|---|
| 2003/0107314 A1* | 6/2003 | Urabe | H01L 27/322 313/506 |
| 2004/0095521 A1* | 5/2004 | Song | G02F 1/133514 349/61 |
| 2005/0117092 A1 | 6/2005 | Park | |
| 2006/0262262 A1 | 11/2006 | Kim | |
| 2007/0002225 A1 | 1/2007 | Baek | |
| 2007/0070267 A1 | 3/2007 | Yang | |
| 2008/0036951 A1 | 2/2008 | Tsai | |
| 2008/0068484 A1 | 3/2008 | Nam | |
| 2008/0198297 A1 | 8/2008 | Choi et al. | |
| 2008/0316398 A1 | 12/2008 | Woo | |
| 2009/0212694 A1 | 8/2009 | Cok | |
| 2010/0194268 A1 | 8/2010 | Choi et al. | |
| 2010/0328360 A1* | 12/2010 | Miyashita | G09G 3/3614 345/690 |
| 2011/0043096 A1 | 2/2011 | Asaki | |
| 2011/0234949 A1* | 9/2011 | Matsui | G02F 1/133512 349/106 |
| 2012/0032151 A1 | 2/2012 | Hama et al. | |
| 2012/0140099 A1 | 6/2012 | Kim | |
| 2012/0206066 A1 | 8/2012 | Takagi | |
| 2012/0250303 A1 | 10/2012 | Asaki | |
| 2013/0010237 A1 | 1/2013 | Fujiyama et al. | |
| 2013/0016137 A1 | 1/2013 | Nakagawa | |
| 2013/0016315 A1 | 1/2013 | Nakagawa | |
| 2013/0119857 A1 | 5/2013 | Su et al. | |
| 2014/0035456 A1 | 2/2014 | Isa | |
| 2014/0062294 A1 | 3/2014 | Toyoda et al. | |
| 2014/0167604 A1* | 6/2014 | Iwata | H05B 33/22 313/504 |
| 2014/0190621 A1* | 7/2014 | Kawata | B32B 38/10 156/155 |
| 2014/0368773 A1* | 12/2014 | Okita | G02F 1/133514 349/106 |
| 2015/0192826 A1 | 7/2015 | Lin | |
| 2015/0277134 A1 | 10/2015 | Kim | |
| 2015/0318447 A1* | 11/2015 | Choi | H01L 27/322 257/98 |
| 2016/0079311 A1* | 3/2016 | Lim | H01L 27/322 257/40 |
| 2016/0139458 A1* | 5/2016 | Ma | G02F 1/133512 349/106 |
| 2016/0223859 A1 | 8/2016 | Lee | |
| 2017/0214863 A1* | 7/2017 | Narabu | G03B 15/00 |
| 2017/0279068 A1* | 9/2017 | Shiratori | H01L 51/5203 |
| 2017/0363894 A1* | 12/2017 | Uchida | G02F 1/1368 |

FOREIGN PATENT DOCUMENTS

| | | |
|---|---|---|
| JP | 2007-220395 | 8/2007 |
| JP | 2008-218365 | 9/2008 |
| JP | 2011-040352 | 2/2011 |
| KR | 20080072976 | 8/2008 |
| KR | 20130015791 | 2/2013 |
| TW | 201320326 | 5/2013 |

OTHER PUBLICATIONS

Chinese Office Action dated Apr. 28, 2016 in corresponding Chinese Application No. 2013-80040123.1.

* cited by examiner

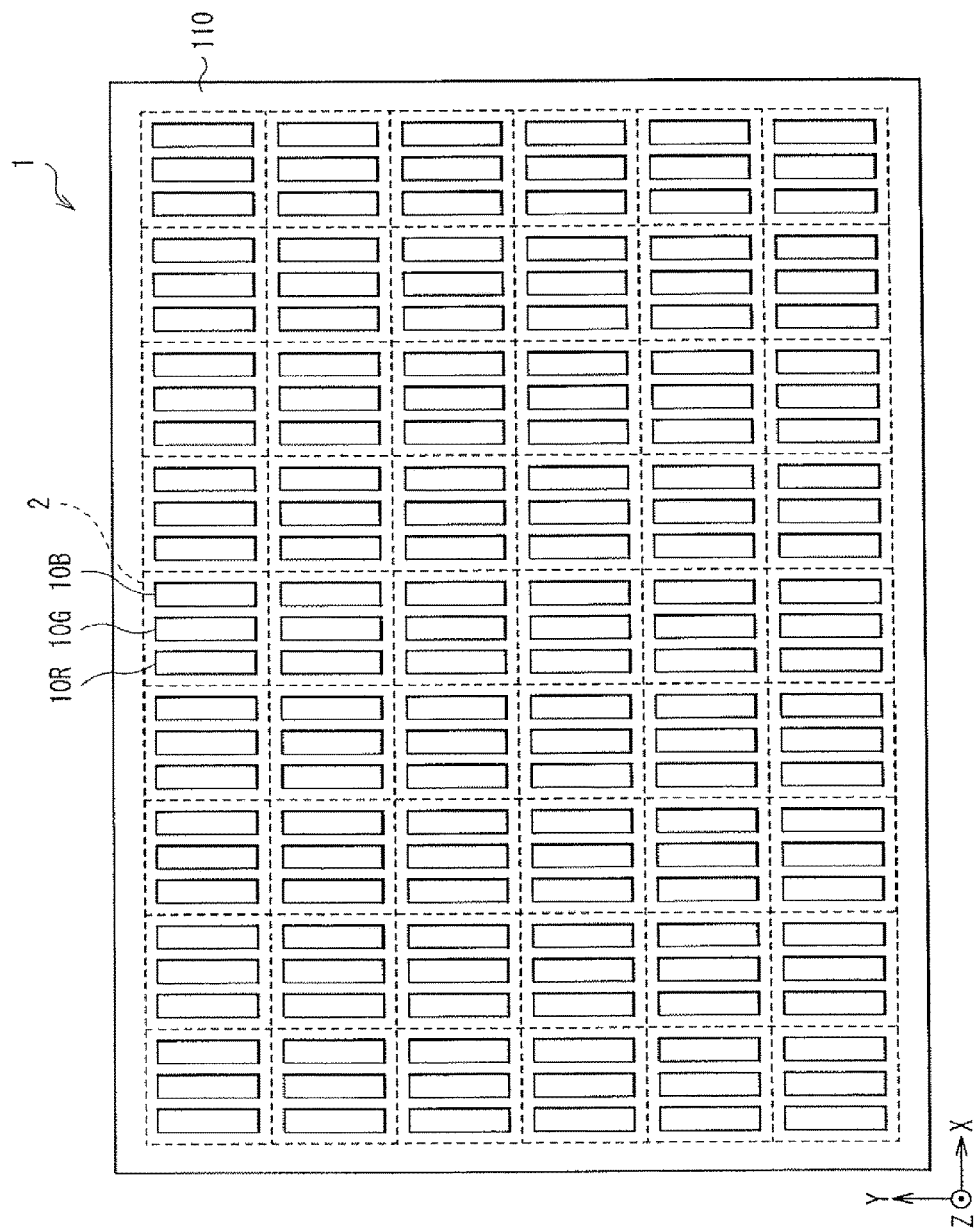

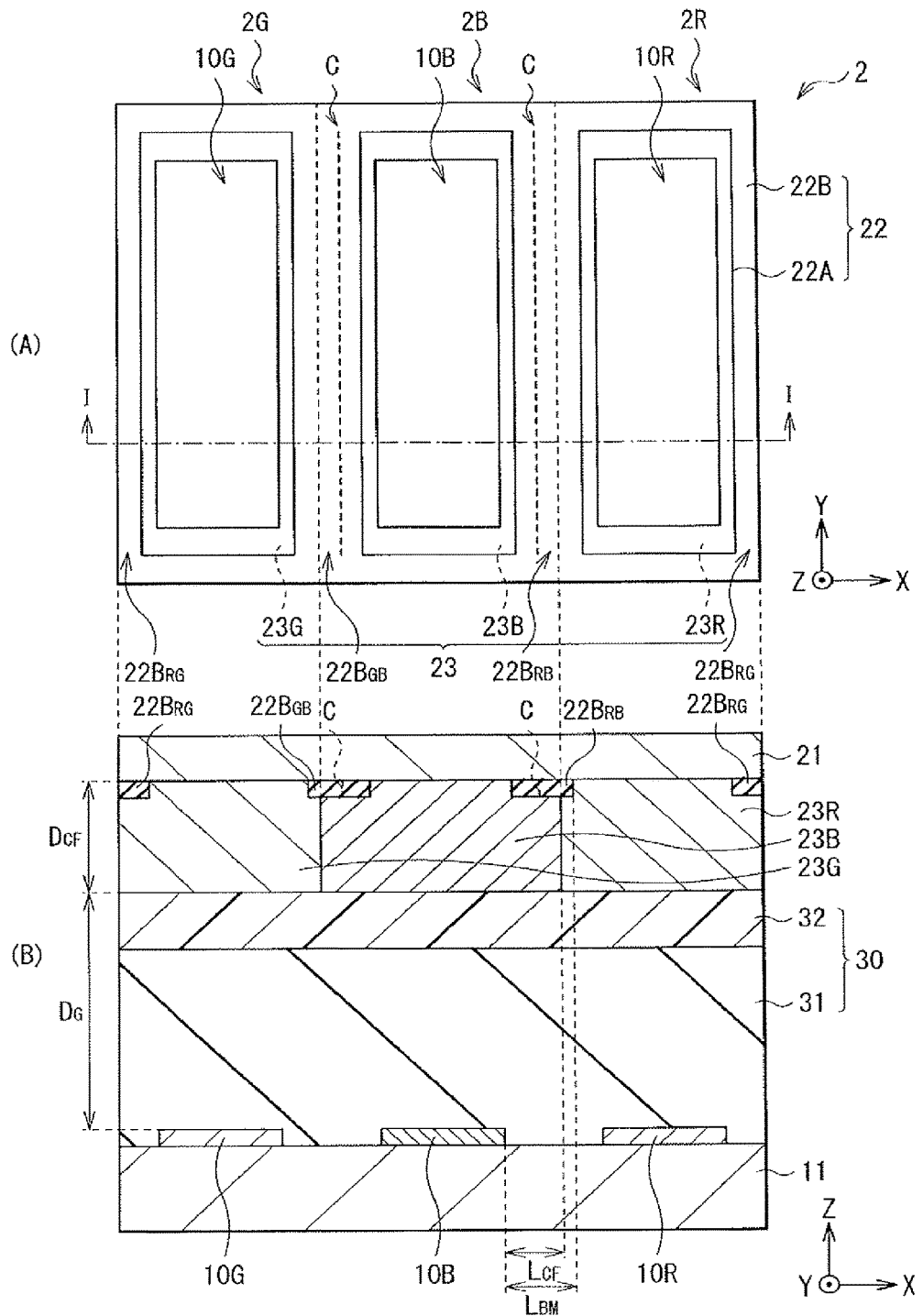
[Fig. 2]

[Fig. 3]
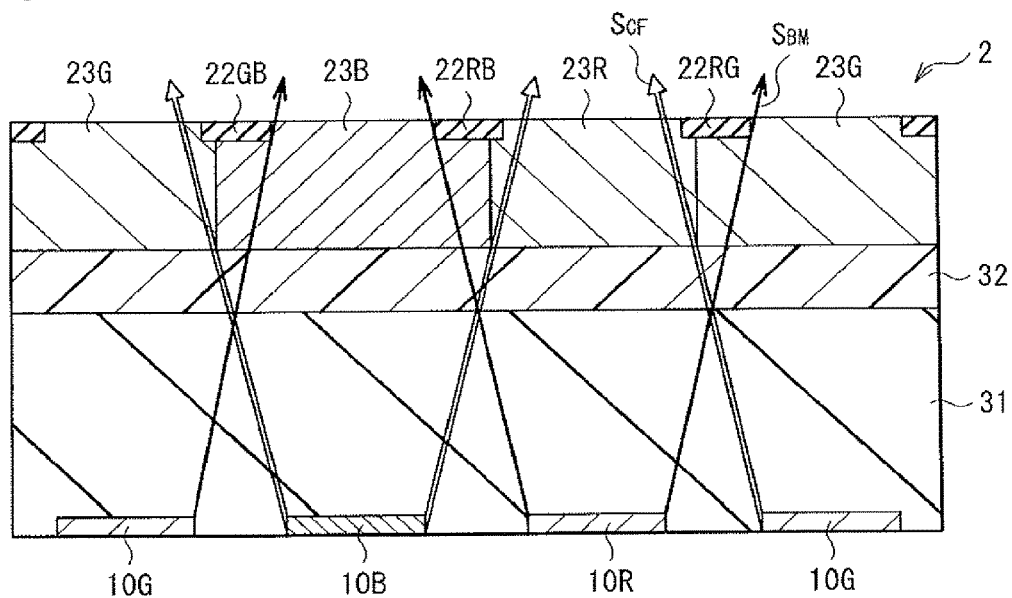
[Fig. 4]
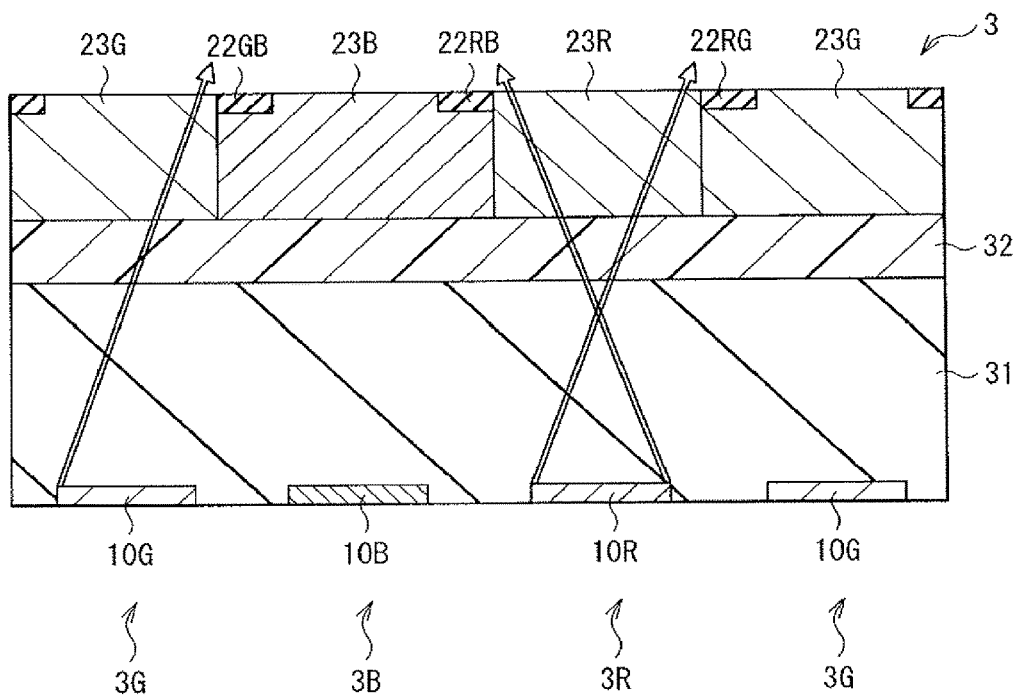

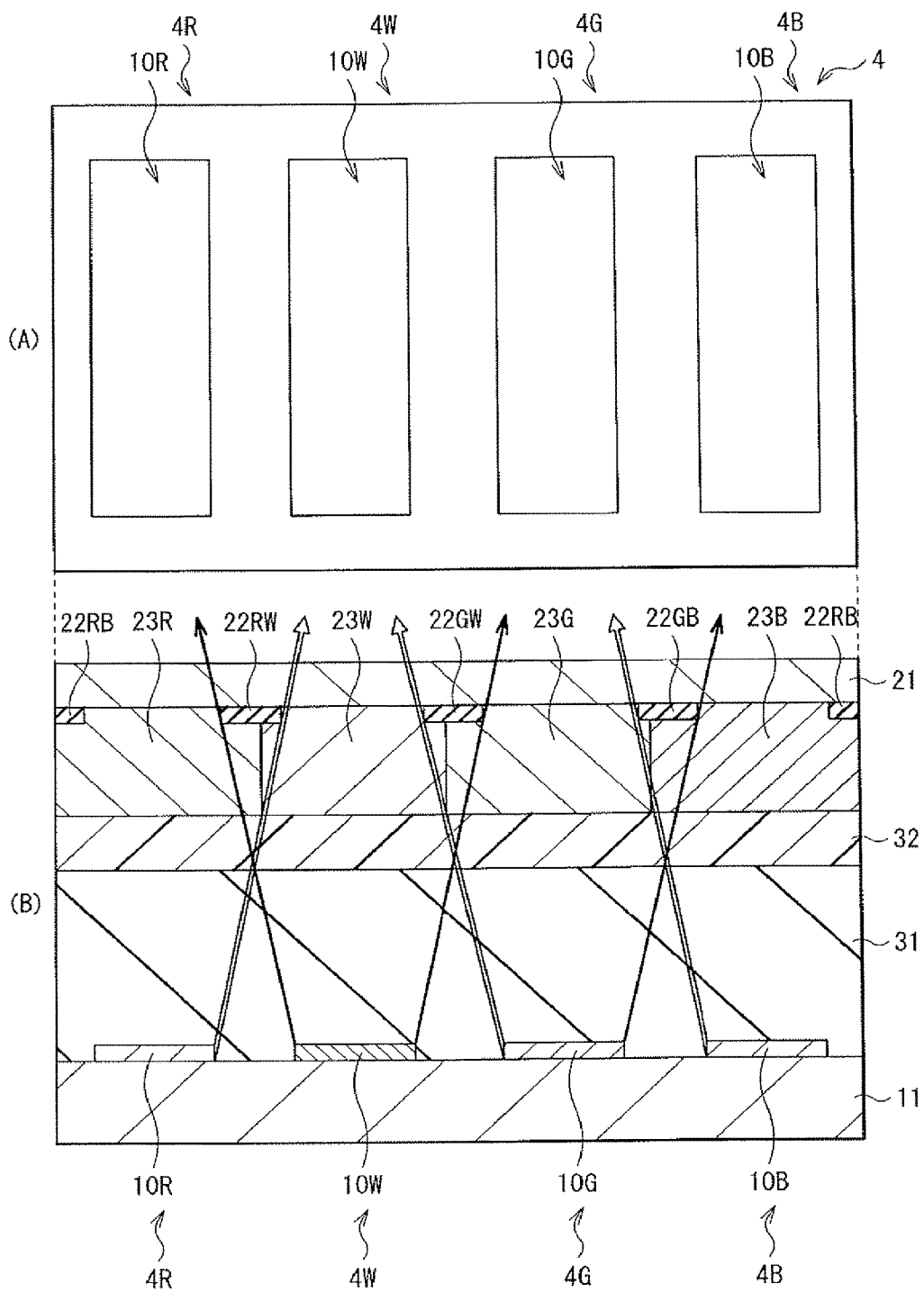
[Fig. 5]

[Fig. 6]
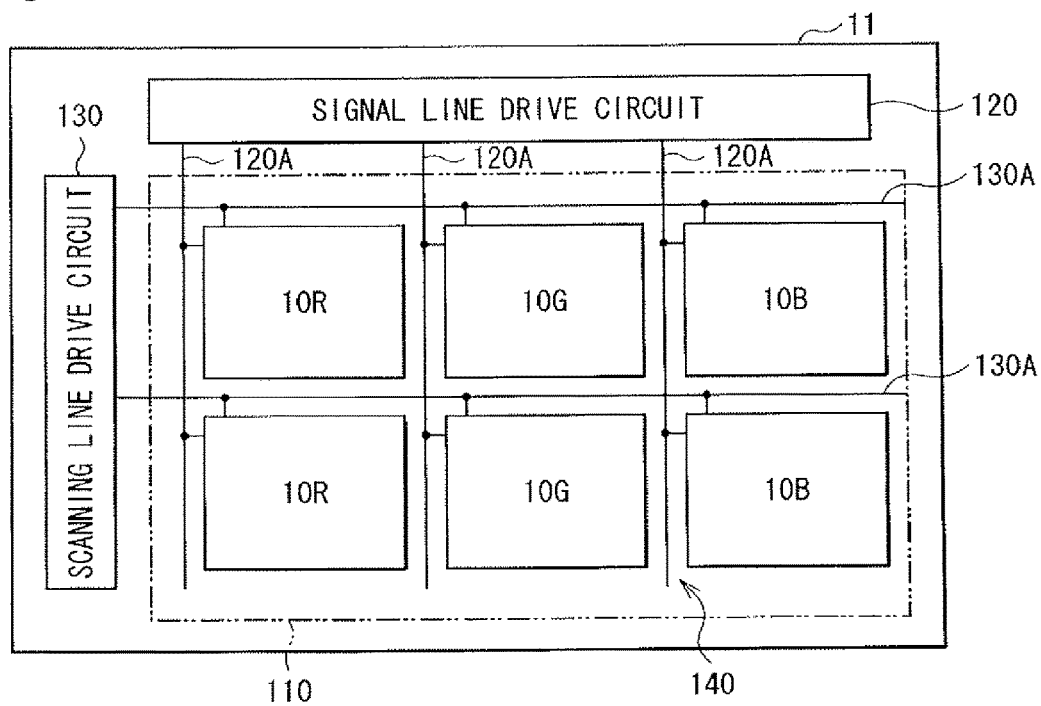
[Fig. 7]
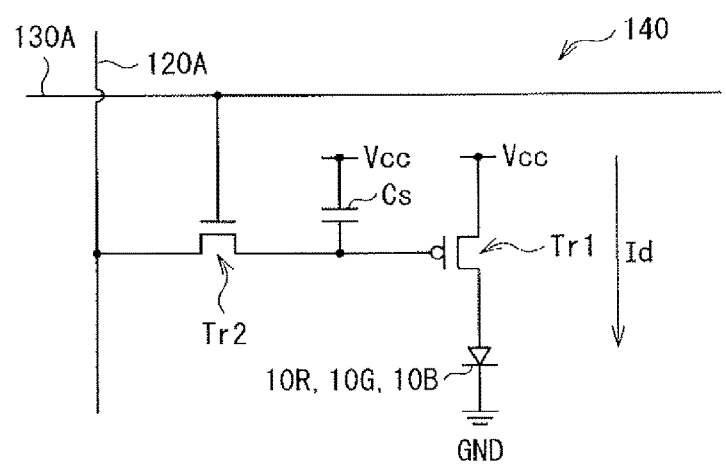

[Fig. 8]
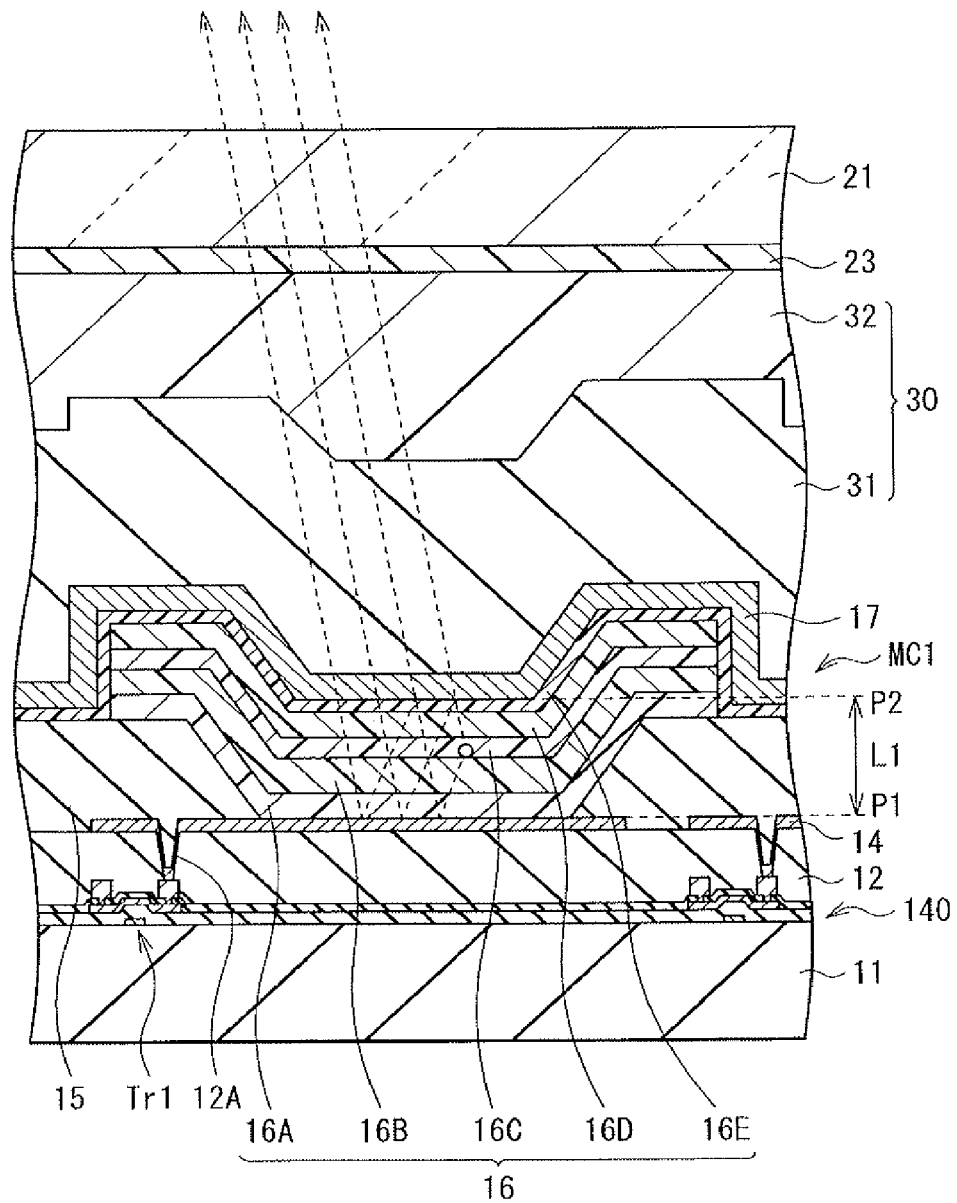

[Fig. 9]
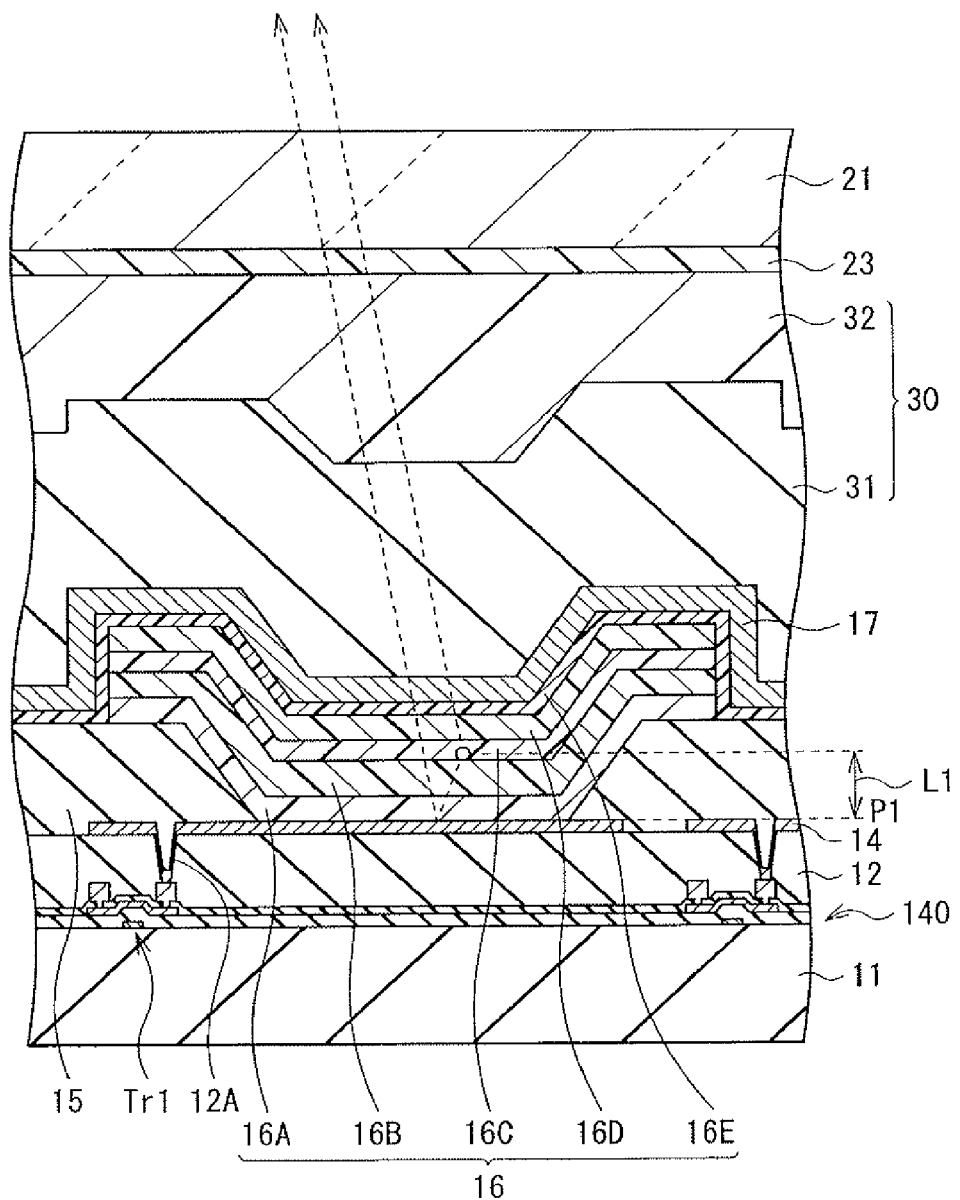

[Fig. 10]
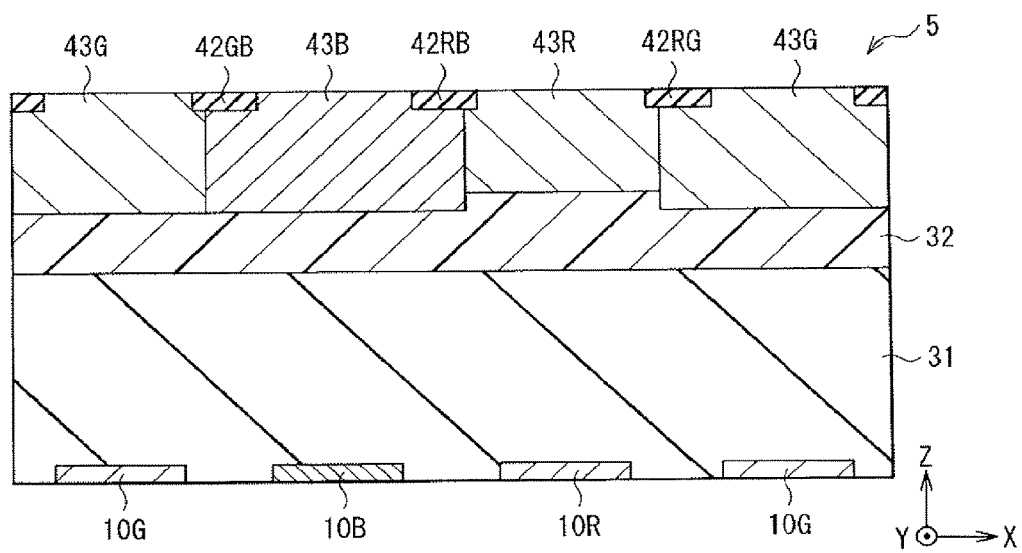
[Fig. 11]
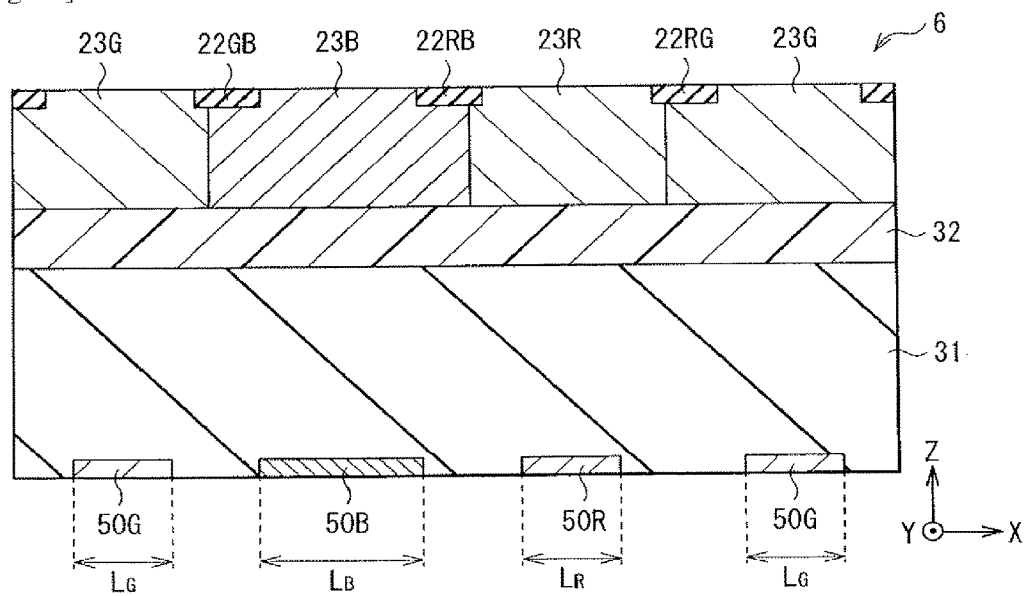

[Fig. 12]
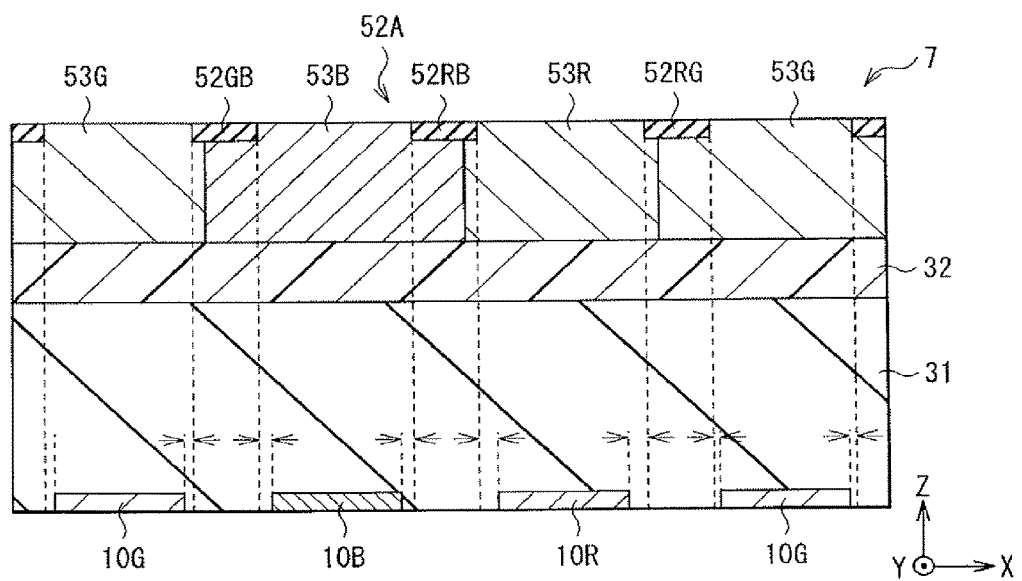

[Fig. 13]
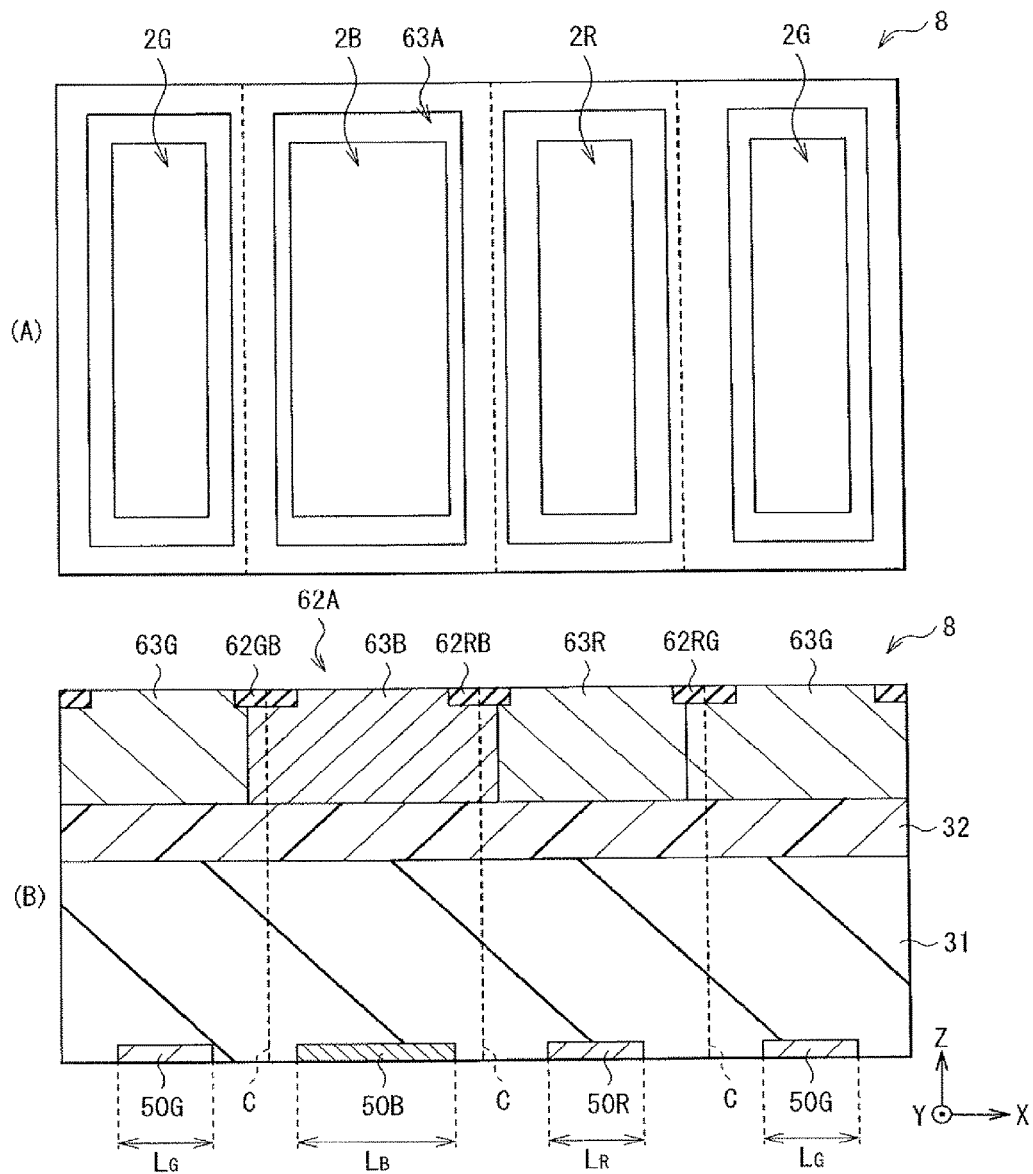

[Fig. 14]
(A) 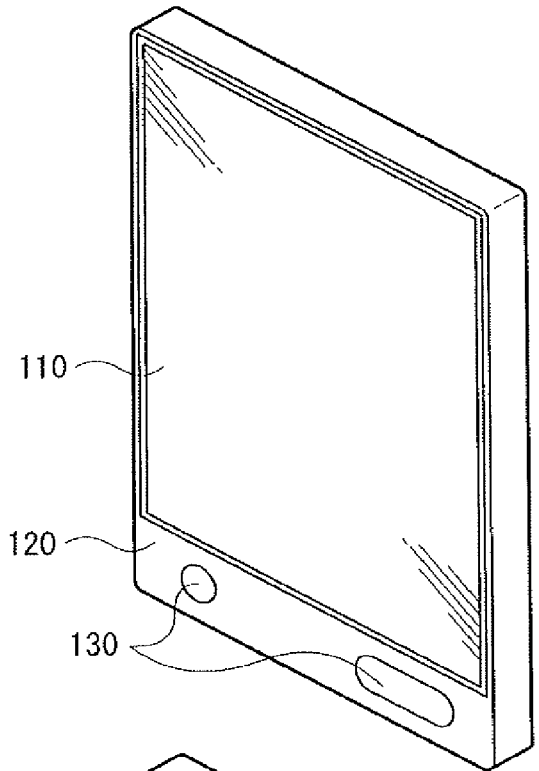
(B) 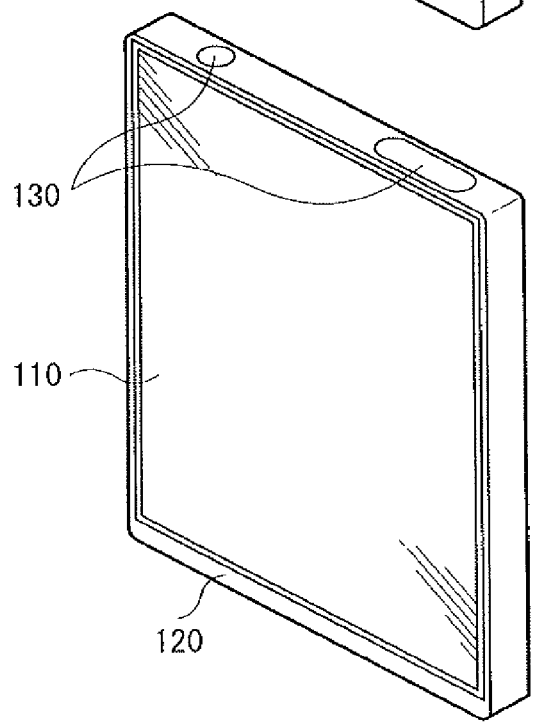

[Fig. 15]
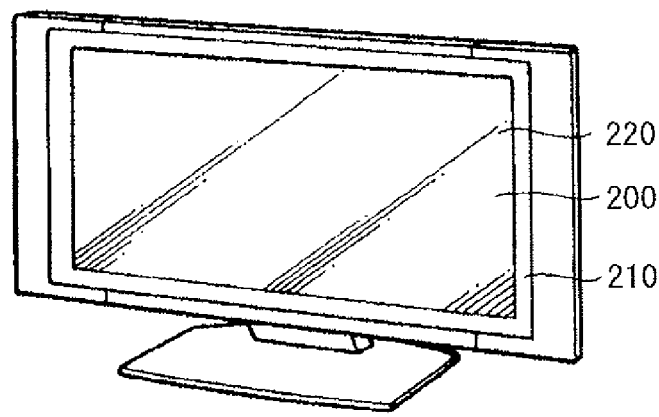
[Fig. 16A]
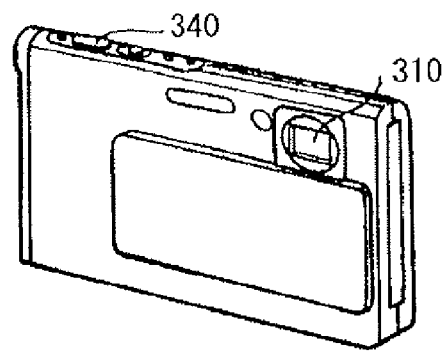
[Fig. 16B]
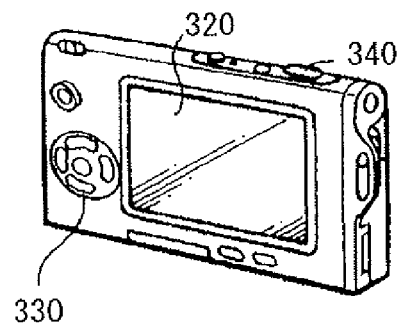

[Fig. 17]
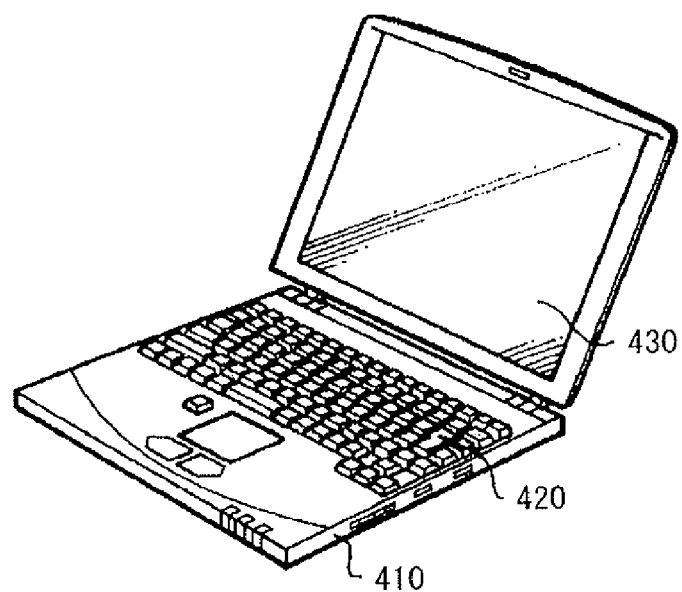
[Fig. 18]
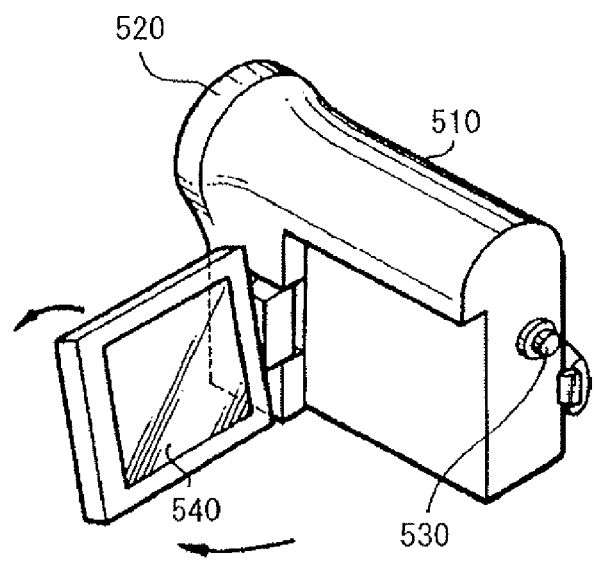

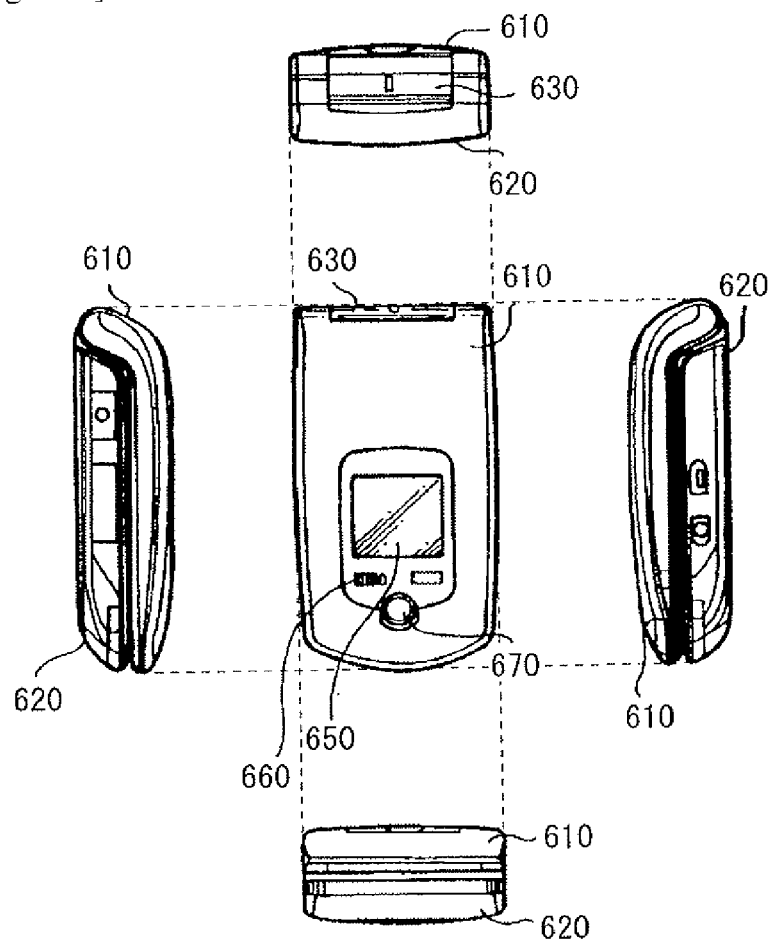
[Fig. 19A]

[Fig. 19B]
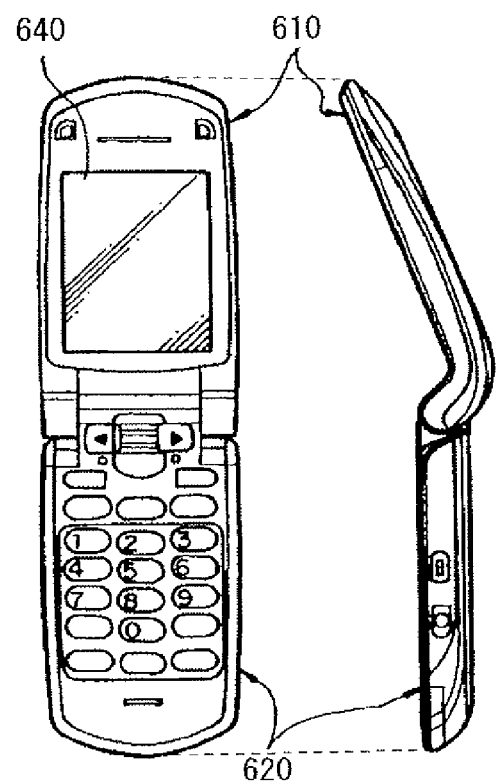

[Fig. 20]
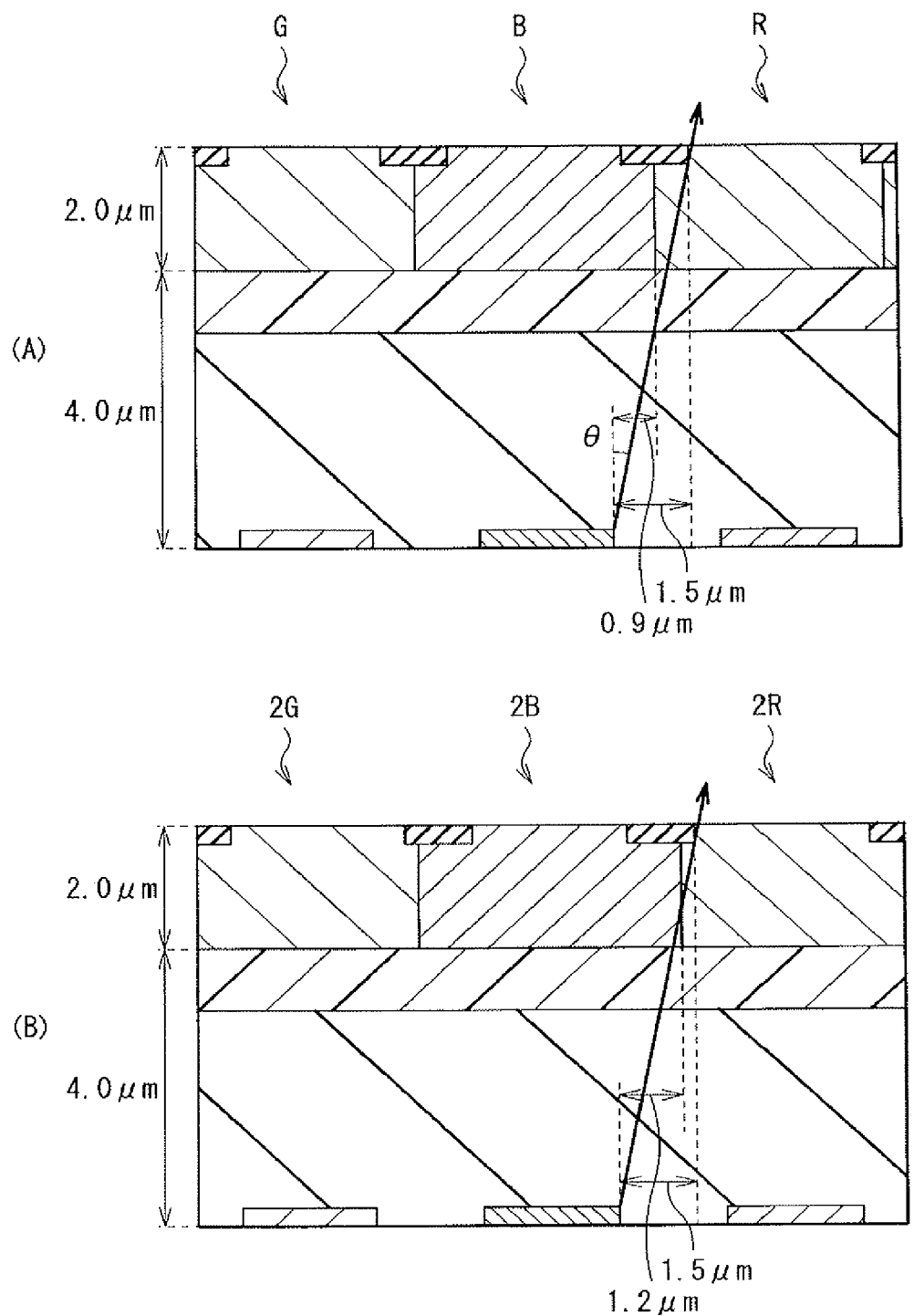

DISPLAY UNIT AND ELECTRONIC APPARATUS

CROSS REFERENCES TO RELATED APPLICATIONS

The present application is a continuation of U.S. patent application Ser. No. 15/096,976, filed on Apr. 12, 2016, which is a continuation of U.S. patent application Ser. No. 14/408,054, filed on Dec. 15, 2014 and issued as U.S. Pat. No. 9,343,516 on May 17, 2016, is a national stage of International Application No. PCT/JP2013/005382 filed on Sep. 11, 2013 which application claims priority to Japanese Priority Patent Application No. 2012-211861, filed in the Japan Patent Office on Sep. 26, 2012, the entire content of which is hereby incorporated by reference.

BACKGROUND

In display units using self-luminous devices such as organic EL devices, the self-luminous devices are provided to one of a pair of substrates, and a light-shielding black matrix is provided to the other substrate. In such full-color display units in related art, colors of light emitted from monochromatic light-emitting devices are mixed to display white or an intermediate color. However, the display units in related art have an issue that when viewing angle characteristics are varied with colors, white balance is disturbed to thereby cause variations in chromaticity of white or an intermediate color depending on viewing angles. When monochromatic light emitted from each light-emitting device is mixed with other colors of light emitted from adjacent light-emitting devices, chromaticity of the monochromatic light is also varied with viewing angles.

Therefore, there is disclosed a display unit in which a clearance in a display plane direction from an end of a light emission region of a light-emitting device to an opening of a light-shielding film is varied for each color to reduce a difference in viewing angle characteristics between colors, thereby suppressing variations in chromaticity of white or an intermediate color depending on viewing angles (for example, refer to Japanese Unexamined Patent Application Publication No. 2011-40352).

Moreover, in a display unit including color filters, a gap dependent on a thickness of a resin layer provided to seal between light-emitting devices and the color filters is formed. Therefore, there is an issue that when the gap causes color leakage from a color filter adjacent to the gap, luminance balance is disturbed, and monochromatic chromaticity is varied, thereby causing a color difference (a color shift) in a wide viewing angle.

To solve this issue, for example, there is disclosed a technique of preventing color leakage from the adjacent color filter and achieving a wider viewing angle through arranging a resin layer with a predetermined thickness below the color filters (for example, refer to Japanese Unexamined Patent Application Publication No. 2006-73219).

However, the techniques in the above-described PTLs 1 and 2 have been developed based on display units including pixels with large dimensions; therefore, in higher-definition display units including pixels with small dimensions (for example, 10 micrometers or less), mixing of colors from adjacent pixels is not sufficiently suppressed, and the techniques are less effective to achieve a wider viewing angle.

It is desirable to provide a display unit and an electronic apparatus each having high viewing angle characteristics irrespective of pixel dimensions.

According to an embodiment of the disclosure, there is provided a display unit that includes a light emitting layer including a light emitting device; a color filter layer including a color filter corresponding to the light emitting device; and a light blocking layer including a light blocking member arranged to overlap an end of the color filter, a center position of the light blocking member being offset from the end of the color filter.

According to an embodiment of the disclosure, there is provided an electronic apparatus including a processor, and a display unit operable with the processor to display an image. The display unit includes: a light emitting layer including a light emitting device, a color filter layer including a color filter corresponding to the light emitting device, and a light blocking layer including a light blocking member arranged to overlap a side face of the color filter, a center position of the light blocking member being offset from and end of the color filter.

In the display unit and the electronic apparatus according to the embodiments of the disclosure, the position of the color boundary between two adjacent ones of the color elements is shifted from the central position of each of the light-shielding sections in the display plane direction to appropriately suppress mixing of colors from adjacent pixels by the color elements or the light-shielding sections.

In the display unit and the electronic apparatus according to the embodiments of the disclosure, since the position of the color boundary between two adjacent ones of the color elements is shifted from the central position of each of the light-shielding sections in the display plane direction, light is allowed to be blocked not only by the light-shielding sections but also by the color elements. Therefore, light-shielding suitable for each pixel is allowed to be selectively performed, and mixing of colors from adjacent pixels is allowed to be suppressed. In other words, a color-mixing start angle is allowed to be optimized irrespective of pixel dimensions, and viewing angle characteristics are improvable.

SUMMARY

The present disclosure relates to a display unit emitting light with use of an organic electroluminescence (EL) phenomenon, and an electronic apparatus including the display unit.

Additional features and advantages are described herein, and will be apparent from the following Detailed Description and the figures.

BRIEF DESCRIPTION OF THE FIGURES

FIG. 1 is a plan view illustrating a configuration of a display unit according to an embodiment of the disclosure.

FIG. 2 is an enlarged plan view (A) and an enlarged sectional view (B) illustrating one pixel of the display unit illustrated in FIG. 1.

FIG. 3 is a schematic view of light-shielding paths in the pixel illustrated in FIG. 2(B).

FIG. 4 is a sectional view illustrating another example of a one-pixel configuration of the display unit illustrated in FIG. 1.

FIG. 5 is a plan view (A) and a sectional view (B) illustrating another example of the one-pixel configuration of the display unit illustrated in FIG. 1.

FIG. 6 is a diagram illustrating a configuration of the display unit illustrated in FIG. 1.

FIG. 7 is a diagram illustrating an example of a pixel drive circuit illustrated in FIG. 6.

FIG. 8 is a sectional view illustrating an example of a configuration of a light-emitting device illustrated in FIG. 7.

FIG. 9 is a sectional view illustrating another example of a configuration of the light-emitting device illustrated in FIG. 7.

FIG. 10 is a sectional view illustrating a configuration of a pixel according to Modification 1.

FIG. 11 is a sectional view illustrating a configuration of a pixel according to Modification 2.

FIG. 12 is a sectional view illustrating a configuration of a pixel according to Modification 3.

FIG. 13 is a plan view (A) and a sectional view (B) illustrating a configuration of a pixel according to Modification 4.

FIG. 14 is a perspective view illustrating an appearance of Application Example 1 of any one of the display units using pixels according to the above-described embodiment and the like.

FIG. 15 is a perspective view illustrating an appearance of Application Example 2.

FIG. 16A is a perspective view illustrating an appearance of Application Example 3 when viewed from a front side.

FIG. 16B is a perspective view illustrating an appearance of Application Example 3 when viewed from a back side.

FIG. 17 is a perspective view illustrating an appearance of Application Example 4.

FIG. 18 is a perspective view illustrating an appearance of Application Example 5.

FIG. 19A is a front view, a left side view, a right side view, a top view, and a bottom view in a state in which Application Example 6 is closed.

FIG. 19B is a front view and a side view in a state in which Application Example 6 is opened.

FIG. 20 is a schematic view illustrating a change in a light-shielding path from a comparative example to an example of the disclosure.

DETAILED DESCRIPTION

Embodiments of the present application will be described below in detail with reference to the drawings.

FIG. 1 illustrates an example of a planar configuration of a display unit (a display unit 1) according to an embodiment of the disclosure. The display unit 1 is used for a television or the like, and has a configuration in which a plurality of pixels 2 are arranged in a matrix in a display region 110. Each of the pixels 2 includes, for example, a red light-emitting device 10R emitting monochromatic red light, a green light-emitting device 10G emitting monochromatic green light, and a blue light-emitting device 10B emitting monochromatic blue light. Each of the light-emitting devices 10R, 10G, and 10B may be configured of, for example, an organic EL device which will be described later, an inorganic EL device, a laser diode, or an LED (Light Emitting Diode).

FIG. 2(A) illustrates an enlarged planar configuration of one pixel 2 illustrated in FIG. 1. In this case, the pixel 2 is configured of three sub-pixels, i.e., a red sub-pixel 2R, a green sub-pixel 2G, and a blue sub-pixel 2B. Corresponding light-emitting devices 10R, 10G, and 10B are provided to the sub-pixels 2R, 2G, and 2B, respectively. Each of the light-emitting devices 10R, 10G, and 10B has a light emission region, and light-shielding sections 22B of a light-shielding film 22 as a black matrix are located at boundaries between two adjacent ones of the light emission regions. Moreover, color elements 23 (23R, 23G, and 23B) of corresponding colors are disposed on the light-emitting devices 10R, 10G, and 10B, respectively.

Each of the light emission regions of the light-emitting devices 10R, 10G, and 10B has, for example, a vertically long rectangular shape, in which a dimension (hereinafter referred to as "length") in a vertical direction (a Y-axis direction) in a display plane is larger than a dimension (hereinafter referred to as "width") in a horizontal direction (an X-axis direction) in the display plane. The sizes of the light emission regions corresponding to the light-emitting devices 10R, 10G, and 10B are proportional to the sizes of the light-emitting devices 10R, 10G, and 10B. In the embodiment, the sizes of the light-emitting devices 10R, 10G, and 10B are equal to one another. It is to be noted that, as used herein, depending on mounting of a thin-film transistor (TFT) or the like located below the light emission region, the term "rectangular shape" refers to not only a geometrically perfect rectangular shape but also a substantially rectangular shape having a notch corresponding to the TFT or the like located below the light emission region. Moreover, as used herein, the term "display plane" refers to a plane (an XY plane) parallel to a paper plane in FIG. 2A.

As illustrated in FIG. 2(A), the light-shielding film 22 includes opening sections 22A in positions corresponding to the light-emitting devices 10R, 10G, and 10B in the Y-axis direction, and includes light-shielding sections 22B (22RG, 22RB, and 22GB) located between two adjacent ones of the opening sections 22A. The light-shielding film 22 extracts, from the opening sections 22A, light emitted from the light-emitting devices 10R, 10G, and 10B, and allows the light-shielding sections 22B to absorb (block) outside light reflected by the light-emitting devices 10R, 10G, and 10B and wiring between the light-emitting devices 10R, 10G, and 10B, and thus to improve color purity. The light-shielding film 22 may be configured of, for example, a black resin film which has an optical density of 1 or over and is mixed with a black colorant, or a thin-film filter using interference of a thin film. In particular, the light-shielding film 22 is preferably configured of the black resin film; therefore, the light-shielding film 22 is allowed to be easily formed at low cost. The thin-film filter may include, for example, one or more thin films made of a metal, a metal nitride, or a metal oxide, and uses interference of the thin films to attenuate light. More specifically, as the thin-film filter, a thin-film filter formed through alternately laminating layers of chromium (Cr) and layers of chromium (III) oxide ($Cr_2O_3$) may be used.

The color elements 23 are generally called color filters, and as with the light-shielding film 22, the color elements 23 improve color purity by extraction of light emitted from the light-emitting devices 10R, 10G, and 10B and absorption of outside light. The color elements 23R, 23G, and 23B of colors corresponding to colors of light emitted from the light-emitting devices 10R, 10G, and 10B are disposed on the light-emitting devices 10R, 10G, and 10B, respectively. The color elements 23R, 23G, and 23B have, for example, a rectangular shape, and are arranged without space. The color elements 23 each are made of, for example, a resin mixed with a pigment, and are adjusted through appropriately selecting the pigment to have high light transmittance in a wavelength range of target red, green, blue, or the like and low light transmittance in other wavelength ranges.

FIG. 2(B) illustrates a sectional configuration taken along a line I-I (an alternate long and short dashed line) in FIG. 2(A) of the pixel 2. The light-emitting devices 10R, 10G, and 10B are disposed on a first substrate 11, and the light-shielding film 22 and the color elements 23 are disposed on a second substrate 21. The first substrate 11 and the second substrate 21 are made of glass, a silicon (Si) wafer, a resin, or the like. The first substrate 11 and the second substrate 21 face each other with the light-emitting devices 10R, 10G, and 10B, the light-shielding film 22, and the color elements 23 in between, and a middle layer 30 made of a resin or the like may be provided between the first substrate 11 and the second substrate 21, if necessary.

(1-1. Description of Principle)

In the embodiment, the above-described light-shielding sections 22B (22RG, 22RB, and 22GB) or the color elements 23 prevent a color of light emitted from a certain sub-pixel from being mixed with other colors of light emitted from sub-pixels adjacent to the certain sub-pixel. More specifically, a position of each of color boundaries between the color elements 23 is determined for each of the sub-pixels 2R, 2G, and 2B to appropriately adjust a color-mixing start angle to an adjacent sub-pixel and to improve viewing angle characteristics.

The light-shielding film 22 and the color elements 23 are formed on the second substrate 21 in this order. In a process of forming them, in the case where the color elements 23 (23R, 23G, and 23B) of a plurality of colors (in this case, three colors of red (R), green (G), and blue (B)) are disposed on the light-shielding film 22 located on the second substrate 21, the position of each of the color boundaries between the color elements 23 determines the color-mixing start angle to each of adjacent sub-pixels 2R, 2G, and 2B. In the embodiment, with use of such characteristics, each of the color boundaries between the color elements 23 is determined for each of the sub-pixels 2R, 2G, and 2B without being limited by a position of each of the light-shielding sections 22B. More specifically, a central position (C) of the light-shielding section 22B and a position of the color boundary between the color elements 23 are shifted from each other in an in-plane X-axis direction to determine the color-mixing start angle by two paths, i.e., a path between "a light-emitting device end and a color element end" and a path between "a light-emitting device end and a light-shielding section end". When light emitted from the adjacent sub-pixels 2R, 2G, and 2B is blocked by these two paths, irrespective of pixel dimensions, viewing angle characteristics are improvable. As used herein, the term "light-emitting device end" refers to an end in a length direction of each of the light-emitting devices 10R, 10G, and 10B arranged in a matrix, and the terms "color element end" and "light-shielding section end" refer in a similar manner to the term "light-emitting device end".

A light-shielding principle by ends of the color element 23 is that light from each of the light-emitting devices 10R, 10G, and 10B is not allowed to pass through the color elements 23 of two kinds. It is to be noted that widths of openings of the sub-pixels 2R, 2G, and 2B are determined by the light-shielding sections 22; therefore, even if the widths of the color elements 23 are varied, light emission efficiency of each of the sub-pixels 2R, 2G, and 2B is not varied.

A condition to use the path between "the light-emitting device end and the color element end" (hereinafter referred to as "color-element light-shielding $S_{CF}$") or the path between "the light-emitting device end and the light-shielding section end" (hereinafter referred to as "light-shielding-section light-shielding $S_{BM}$") is determined by a magnitude relation between a right side and a left side as illustrated in the following expressions (1) and (2). More specifically, when the right side is larger (as illustrated in the expression (1)), the color-element light-shielding $S_{CF}$ is used, and in the case where the left side is larger (as illustrated in the expression (2)), the light-shielding-section light-shielding $S_{BM}$ is used.

[Math. 1]

$$\begin{cases} \dfrac{L_{BM}}{D_G + D_{CF}} \leq \dfrac{L_{CF}}{D_G} & (1) \\ \dfrac{L_{BM}}{D_G + D_{CF}} \geq \dfrac{L_{CF}}{D_G} & (2) \end{cases}$$

where $L_{CF}$ is a distance from the light-emitting device end to a boundary between color elements, $L_{BM}$ is a distance from the light-emitting device end to the light-shielding section end of an adjacent pixel, $D_G$ is a cell gap (a sum (a film thickness of a middle layer) of a film thickness of a protective film and a film thickness of a resin layer), and $D_{CF}$ is a film thickness of the color element.

The expression (1) is a conditional expression in the case where light from adjacent sub-pixels 2R, 2G, and 2B is blocked by the color boundaries between the color elements 23, and the expression (2) is a conditional expression in the case where light from adjacent sub-pixels 2R, 2G, and 2B is blocked by the light-shielding sections 22B. In other words, in the expression (1), the color boundary between the color elements 23 determines the color-mixing start angle, and in the expression (2), an end of the light-shielding section 22B determines the color-mixing start angle. In the case where a right-side value and a left-side value in the above-described expressions (1) and (2) are close to each other (for example, in the case where an $L_{CF}$ value in the expression (2) approximates to an $L_{BM}$ value to change sign), a light-shielding path between a certain sub-pixel and a sub-pixel adjacent to the certain sub-pixel is allowed to be changed. Conditions for optimizing the color-element light-shielding and light-shielding-section light-shielding in each of the sub-pixels 2R, 2G, and 2B will be described below.

Light-shielding paths located between a certain sub-pixel and a sub-pixel adjacent to the certain sub-pixel are preferably used differently in the following manner. In the case where a wavelength of light allowed to pass through the color element 23 of the adjacent sub-pixel is shorter than a wavelength of light allowed to pass through the color element 23 of the certain sub-pixel, light emitted from the adjacent sub-pixel is preferably blocked by the end of the color element 23 to prevent mixing of colors from the adjacent sub-pixel. On the other hand, in the case where the wavelength of light allowed to pass through the color element 23 of the adjacent sub-pixel is longer than the wavelength of light allowed to pass through the color element 23 of the certain sub-pixel, light from the adjacent sub-pixel is preferably blocked by the light-shielding section 22B to prevent mixing of colors from the adjacent sub-pixel. When light-shielding is performed by the light-shielding section 22B in a sub-pixel from which a wavelength of light allowed to pass through the color element 23 of the sub-pixel is longer, light mixed by wavelength dependence of a diffraction angle passes through at low angle to cause deterioration in monochromatic chromaticity and viewing angle characteristics.

On the other hand, in the case where the wavelength of light allowed to pass through the color element 23 of the adjacent sub-pixel (a light emission wavelength of the light-emitting device 10) is shorter, color light from the adjacent sub-pixel is preferably blocked by the end of the color element 23 to prevent the color light from being mixed into color light from the certain sub-pixel. In other words, when the color boundary between the color elements 23 is located closer to the certain sub-pixel, mixing of a color from the adjacent pixel is effectively preventable.

FIG. 3 schematically illustrates a sectional configuration of the pixel 2 and light-shielding paths between the sub-pixels 2R, 2G, and 2B in the embodiment. It is to be noted that the first substrate 11 and the second substrate 21 are not illustrated in FIG. 3. More specifically, the width of the color element 23B located on the blue light-emitting device 10B with a shortest light emission wavelength from among the red light-emitting device 10R, the green light-emitting device 10G, and the blue light-emitting device 10B is wider. In other words, color light from the blue sub-pixel 2B is blocked by the ends of the color element 23B to prevent the color light from being mixed into color light from each of the sub-pixels 2R and 2G adjacent to the blue sub-pixel 2B. Moreover, color light from each of the adjacent sub-pixels 2R and 2G is blocked by the light-shielding sections 22B to prevent the color light from being mixed into color light from the blue sub-pixel 2B.

It is to be noted that, as can be seen from FIG. 3, a portion, which is located closer to the end blocking light of the color element 23, of the light-shielding section 22 (for example, a portion located on the red-pixel 3R of the light-shielding section 22B) does not contribute to light-shielding. Therefore, a portion, which is located on a sub-pixel from which light is blocked by the color element, of the light-shielding section 22 is not necessary. Accordingly, as with a pixel 3 illustrated in FIG. 4, the light-shielding sections 22, more specifically, portions located on a red sub-pixel 3R of light-shielding sections 22RB and 22RG and a portion located on the green sub-pixel 3G of a light-shielding section 22GB may be removed up to the color boundary between the color elements 23. Therefore, the aperture ratios of the red sub-pixel 3R and the green sub-pixel 3G are improved, and light emission efficiency is improved. Moreover, longer life is achievable.

Moreover, in the embodiment, the pixel 2 is configured of the red sub-pixel 2R, the green sub-pixel 2G, and the blue sub-pixel 2B; however, the embodiment is not limited thereto, and, for example, a pixel 4 illustrated in FIGS. 5(A) and (B) configured of pixels of four colors including a white sub-pixel 4W may be used. In this case, as illustrated in FIG. 5(B), a width of a color element 23W located on the white sub-pixel 4W is preferably narrowed, that is, color boundaries between the color elements 23 are preferably located closer to a certain sub-pixel (the white sub-pixel 4W) irrespective of colors of light emitted from adjacent sub-pixels. Moreover, since it is difficult to block color light from the white sub-pixel 4W by the color element 23 to prevent the color light from being mixed into color light from a sub-pixel adjacent to the white sub-pixel 4W, light-shielding-section light-shielding is necessarily performed.

(1-2. Entire Configuration)

FIG. 6 illustrates an example of the display unit 1. As described above, the display unit 1 is used for an organic EL television unit including organic EL devices as the light-emitting devices 10R, 10G, and 10B. The display unit 1 includes, for example, a signal line drive circuit 120 and a scanning line drive circuit 130 as drivers for image display around the display region 110.

A pixel drive circuit 140 is disposed in the display region 110. FIG. 7 illustrates an example of the pixel drive circuit 140. The pixel drive circuit 140 is an active drive circuit formed below a lower electrode 14 which will be described later. In other words, the pixel drive circuit 140 includes, for example, a driving transistor Tr1 and a writing transistor Tr2, a capacitor (a retention capacitor) Cs between these transistors Tr1 and Tr2, and the light-emitting device 10R (or 10G or 10B) connected to the driving transistor Tr1 in series between a first power source line (Vcc) and a second power source line (GND). The driving transistor Tr1 and the writing transistor Tr2 each are configured of a typical thin film transistor (TFT). The TFT may have, for example, an inverted stagger configuration (a so-called bottom gate type) or a stagger configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection of each signal line 120A and each scanning line 130A corresponds to one (a certain sub-pixel) of the light-emitting devices 10R, 10G, and 10B. Each of the signal lines 120A is connected to the signal line drive circuit 120, and an image signal is supplied from the signal line drive circuit 120 to a source electrode of the writing transistor Tr2 through the signal line 120A. Each of the scanning lines 130A is connected to the scanning line drive circuit 130, and a scanning signal is sequentially supplied from the scanning line drive circuit 130 to a gate electrode of the writing transistor Tr2 through the scanning line 130A.

FIG. 8 illustrates sectional configurations of the light-emitting devices 10R, 10G, and 10B. Each of the light-emitting devices 10R, 10G, and 10B is formed through laminating the driving transistor Tr1 of the above-described pixel drive circuit 140, a planarization insulating film 13, the lower electrode 14 as an anode, an inter-electrode insulating film 15, an organic layer 16 including a light-emitting layer 16C which will be described later, and an upper electrode 17 as a cathode in this order from a side closer to the first substrate 11. The driving transistor Tr1 is electrically connected to the lower electrode 14 through a connection hole 13A provided to the planarization insulating film 13.

Such light-emitting devices 10R, 10G, and 10B are covered with a protective layer 31, and the second substrate 21 is bonded to an entire surface of the protective layer 31 with a resin layer 32 in between to seal the light-emitting devices 10R, 10G, and 10B. The protective layer 31 is made of silicon nitride ($SiN_x$), silicon oxide, a metal oxide, or the like. The resin layer 32 is made of, for example, a thermosetting resin or an ultraviolet curable resin. It is to be noted that the above-described middle layer 30 is configured of the protective layer 31 and the resin layer 32.

The planarization insulating film 13 planarizes a surface where the pixel drive circuit 140 is formed of the first substrate 11, and is preferably made of a material with high pattern accuracy, because a minute connection hole 13A is formed in the planarization insulating film 13. Examples of the material of the planarization insulating film 13 include organic materials such as polyimide and inorganic materials such as silicon oxide ($SiO_2$).

The lower electrode 14 also serves as a reflective layer, and preferably has highest possible reflectivity to enhance light emission efficiency. In particular, in the case where the lower electrode 14 is used as an anode, the lower electrode 14 is preferably made of a material with a high hole injection property. Such a lower electrode 14 has, for example, a thickness in a laminate direction (hereinafter simply referred to as "thickness") of about 100 nm to about 1000 nm both inclusive, and is made of a simple substance or an alloy of a metal element such as chromium (Cr), gold (Au), platinum (Pt), nickel (Ni), copper (Cu), tungsten (W), or silver (Ag). A transparent conductive film made of an oxide of indium and tin (ITO) or the like may be formed on a surface of the lower electrode 14. It is to be noted that, even a material, such as an aluminum alloy, which has an undesirable hole injection barrier due to existence of an oxide film on a surface thereof or a work function which is not large enough while having high reflectivity, may be used for the lower electrode 14 through providing an appropriate hole injection layer.

The inter-electrode insulating film 15 secures insulation between the lower electrode 14 and the upper electrode 17, and forms a light emission region into a desired shape. The inter-electrode insulating film 15 is made of, for example, a photosensitive resin. The inter-electrode insulating film 15 is disposed only around the lower electrode 14, and a region exposed from the inter-electrode insulating film 15 of the lower electrode 14 serves as a light emission region. It is to be noted that, although the organic layer 16 and the upper electrode 17 are disposed on the inter-electrode insulating film 15, light is emitted from only the light emission region.

The organic layer 16 has, for example, a configuration in which a hole injection layer 16A, a hole transport layer 16B, the light-emitting layer 16C, an electron transport layer 16D, and an electron injection layer 16E are laminated in this order from a side closer to the lower electrode 14. These layers other than the light-emitting layer 16C may be included, if necessary. The organic layer 16 may be different in configuration depending on colors of light emitted from the light-emitting devices 10R, 10G, and 10B. The hole injection layer 16A enhances hole injection efficiency and is a buffer layer for preventing leakage. The hole transport layer 16B enhances hole transport efficiency to the light-emitting layer 16C. The light-emitting layer 16C emits light by the recombination of electrons and holes in response to the application of an electric field. The electron transport layer 16D enhances electron transport efficiency to the light-emitting layer 16C. The electron injection layer 16E enhances electron injection efficiency.

The hole injection layer 16A of the light-emitting device 10R has, for example, a thickness of about 5 nm to about 300 nm both inclusive, and is made of a hexaazatriphenylene derivative represented by Chemical Formula 1 or Chemical Formula 2. The hole transport layer 16B of the light-emitting device 10R has, for example, a thickness of about 5 nm to about 300 nm both inclusive, and is made of bis[(N-naphthyl)-N-phenyl]benzidine (alpha-NPD). The light-emitting layer 16C of the light-emitting device 10R has, for example, a thickness of about 10 nm to about 100 nm both inclusive, and is made of 8-quinolinol aluminum complex (Alq3) mixed with 40 vol % of 2,6-bis<4-<N-(4-methoxyphenyl)-N-phenyl>aminostyryl>naphthalene-1,5-dicarbonitrile (BSN-BCN). The electron transport layer 16D of the light-emitting device 10R has, for example, a thickness of about 5 nm to about 300 nm both inclusive, and is made of Alq3. The electron injection layer 16E of the light-emitting device 10R has, for example, a thickness of about 0.3 nm, and is made of LiF, Li$_2$O, or the like.

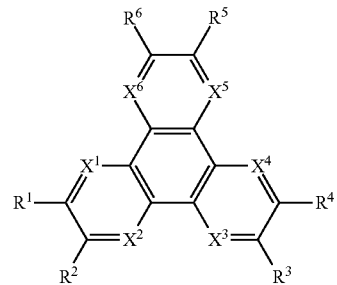

[Chem. 1]

where $R^1$ to $R^6$ each are independently a substituted group selected from a group configured of hydrogen, a halogen, a hydroxyl group, an amino group, an arylamine group, a substituted or unsubstituted carbonyl group with 20 or less carbon atoms, a substituted or unsubstituted carbonyl ester group with 20 or less carbon atoms, a substituted or unsubstituted alkyl group with 20 or less carbon atoms, a substituted or unsubstituted alkenyl group with 20 or less carbon atoms, a substituted or unsubstituted alkoxyl group with 20 or less carbon atoms, a substituted or unsubstituted aryl group with 30 or less carbon atoms, a substituted or unsubstituted heterocyclic group with 30 or less carbon atoms, a nitrile group, a cyano group, a nitro group, and a silyl group, and adjacent groups Rm, where m=1 to 6, may be joined together through a cyclic structure, and $X^1$ to $X^6$ each are independently a carbon atom or a nitrogen atom.

More specifically, the hole injection layer 16A of the light-emitting device 10R is preferably made of a material represented by Chemical Formula 2.

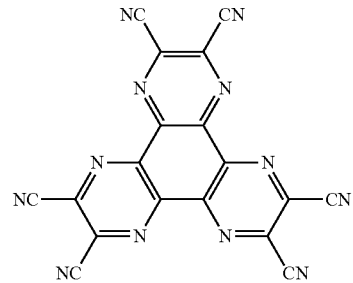

[Chem. 2]

The hole injection layer 16A of the light-emitting device 10G has, for example, a thickness of about 5 nm to about 300 nm both inclusive, and is made of a hexaazatriphenylene derivative represented by Chemical Formula 1 or 2. The hole transport layer 16B of the light-emitting device 10G has, for example, a thickness of about 5 nm to about 300 nm both inclusive, and is made of alpha-NPD. The light-emitting layer 16C of the light-emitting device 10G has, for example, a thickness of about 10 nm to about 100 nm both inclusive, and is made of Alq3 mixed with 1 vol % of Coumarin6. The electron transport layer 16D of the light-emitting device 10G has, for example, a thickness of about 5 nm to about 300 nm both inclusive, and is made of Alq3. The electron injection layer 16E of the light-emitting device 10G has, for example, a thickness of about 0.3 nm, and is made of LiF, Li$_2$O or the like.

The hole injection layer 16A of the light-emitting device 10B has, for example, a thickness of about 5 nm to about 300 nm both inclusive, and is made of a hexaazatriphenylene derivative represented by Chemical Formula 1 or 2. The hole transport layer 16B of the light-emitting device 10B has, for example, a thickness of about 5 nm to about 300 nm both inclusive, and is made of alpha-NPD. The light-emitting layer 16C of the light-emitting device 10B has, for example, a thickness of about 10 nm to about 100 nm both inclusive, and is made of spiro6P (phi). The electron transport layer 16D of the light-emitting device 10B has, for example, a thickness of about 5 nm to 300 nm both inclusive, and is made of Alq3. The electron injection layer 16E of the light-emitting device 10G has, for example, a thickness of about 0.3 nm, and is made of LiF, $Li_2O$, or the like.

The upper electrode 17 has, for example, a thickness of about 10 nm, and is made of an alloy of aluminum (Al), magnesium (Mg), calcium (Ca), or sodium (Na). In particular, an alloy of magnesium and silver (an Mg—Ag alloy) is preferable, because the Mg—Ag alloy has both electrical conductivity and small absorption in a thin film. The ratio between magnesium and silver in the Mg—Ag alloy is not specifically limited, but the ratio is preferably within a range of Mg:Ag=about 20:1 to 1:1 both inclusive in film thickness ratio. Moreover, the material of the upper electrode 17 may be an alloy of Al and Li (an Al—Li alloy).

The upper electrode 17 also serves as a semi-transmissive reflective layer. In other words, the light-emitting device 10R has a resonator structure MC1, and the resonator structure MC1 allows light emitted from the light-emitting layer 16C to be resonated between the lower electrode 14 and the upper electrode 17. In the resonator structure MC1, an interface between the lower electrode 14 and the organic layer 16 serves as a reflective surface P1, an interface between the middle layer 18 and the electron injection layer 16E serves as a semi-transmissive reflective surface P2, and the organic layer 16 serves as a resonating section, and the resonator structure MC1 allows light emitted from the light-emitting layer 16C to be resonated, and extracts the light from the semi-transmissive reflective surface P2. When the resonator structure MC1 is included, light emitted from the light-emitting layer 16C causes multiple interference to reduce a half-width of a spectrum of light extracted from the semi-transmissive reflective surface P2, thereby increasing peak intensity. In other words, light radiant intensity in a front direction is increased to improve color purity of emitted light. Moreover, outside light incident from the second substrate 21 is attenuated by multiple interference, and reflectivity of outside light in the light-emitting devices 10R, 10G, and 10B and the white light-emitting device 10W illustrated in FIG. 5 is reduced to an extremely small value by a combination with the color elements 23.

To do so, an optical distance L1 between the reflective surface P1 and the semi-transmissive reflective surface P2 preferably satisfies Mathematical Expression 2.

$$(2L1)/\lambda + \Phi/(2\pi) = m \quad \text{[Math. 2]}$$

where L1 is an optical distance between the reflective surface P1 and the semi-transmissive reflective surface P2, m is an order (0 or a natural number), $\Phi$ is a sum ($\Phi=\Phi 1+\Phi 2$) (rad) of a phase shift $\Phi 1$ of reflected light from the reflective surface P1 and a phase shift $\Phi 2$ of reflected light from the semi-transmissive reflective surface P2, $\lambda$ is a peak wavelength of a spectrum of light which is desired to be extracted from the semi-transmissive reflective surface P2, and L and $\lambda$ may be expressed in a common unit, for example, nm.

Positions (resonance surfaces) at which light emission intensity of extracted light is maximized exist between the reflective surface P1 and the semi-transmissive reflective surface P2. The number of resonance surfaces is m+1. Under the condition of m=1 or more, in the case where a light emission surface is located on a resonance surface closest to the reflective surface P1, the half-width of an emission spectrum becomes largest.

It is to be noted that, as illustrated in FIG. 9, the light-emitting devices 10R, 10G, and 10B may not be provided with the semi-transmissive reflective surface P2, and light emitted from the light-emitting layer 16C may be reflected by the reflective surface P1 so as to cause an interference between the reflected light and the light emitted from the light-emitting layer 16C.

In this case, the light-emitting layer 16C preferably has a position (an interference position) at which reflected light and light emitted from the light-emitting layer 16C constructively interfere with each other. Moreover, the optical distance L1 between the reflective surface P1 and the interference position preferably satisfies Mathematical Expression 3.

$$(2L1)/\lambda + \Phi/(2\pi) = m \quad \text{[Math. 3]}$$

where L1 is an optical distance between the reflective surface P1 and the interference position, m is an order (0 or a natural number), $\Phi$ is a phase shift $\Phi$ (rad) of reflected light from the reflective surface P1, $\lambda$ is a peak wavelength of a spectrum when light emitted from the light-emitting layer 16C exits from the upper electrode 17, and L and $\lambda$ may be expressed in a common unit, for example, nm.

In the light-emitting devices 10R, 10G, and 10B having such a resonator structure MC1, or using interference between light emitted from the light-emitting layer 16C and reflected light from the reflective surface P1, there is a tendency that as the order m increases, viewing angle dependence of luminance and chromaticity, namely, a difference in luminance or chromaticity between a front view and an oblique view is increased. In the case where an organic EL display unit is intended to be used for a typical television or the like, reduction in luminance and variation in chromaticity according to viewing angles are preferably small.

Only in view of viewing angle characteristics, a condition of m=0 is ideal. However, under such a condition, the thickness of the organic layer 16 is small, which may cause an influence on light emission characteristics, or a short circuit between the lower electrode 14 and the upper electrode 17. Therefore, for example, a condition of m=1 is used to avoid an increase in viewing angle dependence of luminance or chromaticity and to suppress degradation in light emission characteristics or occurrence of a short circuit. For example, in the case where the lower electrode 14 is made of an aluminum alloy, and the upper electrode 17 is made of an Mg—Ag alloy, the thickness of the organic layer 16 of the blue light-emitting device 10B is about 80 nm under the condition of m=0, and is about 190 nm under the condition of m=1; therefore, a short circuit is suppressed under the condition of m=1.

Moreover, since a resonator effect or an interference effect of the resonator structure MC1 is caused under optical conditions different for each color of light emitted, viewing angle characteristics are generally different for each color of light emitted. In a full-color display unit, since white or an intermediate color is displayed through mixing colors of monochromatic light, such a difference in monochromatic viewing angle characteristics between colors of light emitted disturbs white balance, and chromaticity of white or an intermediate color is varied with viewing angles.

The display unit 1 may be manufactured by the following process, for example.

First, the pixel drive circuit 140 including the driving transistors Tr1 is formed on the first substrate 11 made of the above-described material, and then an entire surface of the pixel drive circuit 140 is coated with a photosensitive resin to form the planarization insulating film 13. Then, the planarization insulating film 13 is patterned into a predetermined shape along with formation of the connection hole 13A through exposure and development, and then is fired.

Next, the lower electrode 14 made of the above-described material is formed by, for example, a sputtering method, and the lower electrode 14 is selectively removed by wet etching to separate the light-emitting devices 10R, 10G, and 10B from one another.

Then, an entire surface of the first substrate 11 is coated with a photosensitive resin, and opening sections are formed corresponding to light emission regions by, for example, a photolithography method, and then the photosensitive resin is fired to form the inter-electrode insulating film 15.

After that, the hole injection layer 16A, the hole transport layer 16B, the light emitting layer 16C, and the electron transport layer 16D, each of which is made of the above-described material with the above-described thickness, of the organic layer 16 are formed by, for example, an evaporation method.

After the organic layer 16 is formed, the upper electrode 17 made of the above-described material with the above-described thickness is formed by, for example, an evaporation method. Thus, the light-emitting devices 10R, 10G, and 10B as illustrated in FIG. 8 or FIG. 9 are formed.

Next, the protective layer 31 made of the above-described material is formed on the light-emitting devices 10R, 10G, and 10B by, for example, a CVD method or a sputtering method.

Then, for example, the second substrate 21 made of the above-described material is coated with the material of the light-shielding film 22 by spin coating or the like, and the material of the light-shielding film 22 is patterned by photolithography, and then is fired to form the light-shielding film 22 (not illustrated in FIG. 8). Next, the color elements 23 are sequentially formed in a manner similar to the manner of forming the light-shielding film 22.

After that, the resin layer 32 is formed on the protective layer 31, and the second substrate 21 is bonded to the protective layer 31 with the resin layer 32 in between. Thus, the display unit 1 illustrated in FIGS. 6 to 9 is completed.

In the display unit 1, a scanning signal is supplied from the scanning line drive circuit 130 to each pixel 2 through the gate electrode of the writing transistor Tr2, and an image signal supplied from the signal line drive circuit 120 is retained in the retention capacitor Cs through the writing transistor Tr2. In other words, on-off control of the driving transistor Tr1 is performed in response to the signal retained in the retention capacitor Cs, and a drive current Id is thereby injected into each of the light-emitting devices 10R, 10G, and 10B to allow each of the light-emitting devices 10R, 10G, and 10B to emit light by the recombination of holes and electrons. This light is multiply-reflected between the lower electrode 14 (the reflective surface P1) and the upper electrode 17 (the semi-transmissive reflective surface P2), or reflected light from the lower electrode 14 (the reflective surface P1) and light emitted from the light-emitting layer 16C constructively interfere with each other, and the multiply-reflected light or light generated by constructive interference passes through the upper electrode 17, the color element 23, and the second substrate 21 to be extracted.

(Functions and Effects)

In the embodiment, irrespective of the positions of the light-shielding sections 22B, a color width of each of the color elements 23, namely, a position of each color boundary is determined for each of the sub-pixels 2R, 2G, and 2B depending on a relationship between light emission wavelengths of a certain sub-pixel and sub-pixels adjacent to the certain sub-pixel. Therefore, mixing of colors from adjacent sub-pixels is preventable by two light-shielding paths, namely, the light-shielding-section light-shielding $S_{BM}$ and the color-element light-shielding $S_{CF}$, and a path suitable for each of the sub-pixels 2R, 2G, and 2B is selected. Therefore, the color-mixing start angle is allowed to be increased irrespective of pixel dimensions, and a monochromatic viewing angle is allowed to be increased. Moreover, when the position of each of the color boundaries between the color elements 23 is optimized, degradation in color mixing at a lower angle by diffraction is allowed to be minimized.

Moreover, when mixing of colors from the adjacent sub-pixels is prevented by the color elements 23, a portion on the certain sub-pixel of the light-shielding section 22B is unnecessary; therefore, the unnecessary portion of the light-shielding section 22B may not be included. Thus, the aperture ratio is improved, and the viewing angle is increased. Further, the improved aperture ratio improves light emission efficiency. In addition, reduction in luminance is allowed to be suppressed, that is, longer life is achievable.

Next, modifications of the above-described embodiment will be described below. Like components are denoted by like numerals as of the above-described embodiment and will not be further described.

2. MODIFICATIONS (Modification 1)

FIG. 10 illustrates a sectional configuration of a pixel 5 of a display unit according to Modification 1. The pixel 5 is different from the above-described embodiment in that thicknesses of color elements 43 (43R, 43G, and 43B) are different for sub-pixels 5R, 5G, and 5B. More specifically, film thicknesses of the color elements 43G and 43B of sub-pixels (in this case, the green sub-pixel 5R and the blue sub-pixel 5B) from which color light is blocked by the color-element light-shielding $S_{CF}$ so as to prevent the color light from being mixed into color light emitted from sub-pixels adjacent thereto is increased (to be larger than a film thickness of the red color element 43R by about 0.5 micrometers). Thus, the color-mixing start angle is further increased, and the viewing angle is allowed to be increased. It is to be noted that, as the thicknesses of the color elements 43 are increased, the color-mixing start angle becomes wider; however, the thicknesses of the color elements 43 are preferably within a range small enough not to allow the color elements 43 and the light-emitting devices 10 to come into contact with each other when the first substrate 11 and the second substrate 21 are bonded together, and are preferably equal to a film thickness of the resin layer 32 at maximum. In terms of a failure in injection of a resin (the formation of the resin layer 32) which is performed after bonding the first substrate 11 and the second substrate 21 together, or stress on the first substrate 11 generated when bonding the first substrate 11 and the second substrate 21 together, the film thickness of the resin layer 32 in the sub-pixel having the color element 43 with an increased thickness is more preferably about 0.5 micrometers.

(Modification 2)

FIG. 11 illustrates a sectional configuration of a pixel 6 of a display unit according to Modification 2. The pixel 6 is different from the above-described embodiment and Modification 1 in that a width of a light emission region (a width in the X-axis direction of a light-emitting device 50) is varied with light-emitting devices 50 (50R, 50G, and 50B). More specifically, a formation region $L_B$ of the blue light-emitting device 50B provided to a blue sub-pixel 6B is expanded in the X-axis direction. Since diffraction is dependent on wavelength in blue light emitted from the blue sub-pixel 6B, compared to other sub-pixels (6R and 6G), viewing angle characteristics of the blue sub-pixel 6B are narrower; therefore, viewing angle coloring in a white raster is prevented.

Thus, in addition to the effects in the above-described embodiment, the viewing angle of the blue sub-pixel 6B is increased while the color-mixing start angles from adjacent pixels are maintained, light emission efficiency is improved. Moreover, light emission life is improved.

(Modification 3)

FIG. 12 illustrates a sectional configuration of a pixel 7 of a display unit according to Modification 3. The pixel 7 is different from the above-described embodiment and Modifications 1 and 2 in that an opening width in the X-axis direction of an opening section 52A of a light-shielding film 52 is varied with sub-pixels 7R, 7G, and 7B. More specifically, a distance between an end located in the green sub-pixel 7G of a light-shielding section 52GB and an end of the green light-emitting device 10G is preferably larger than a distance between an end in the blue sub-pixel 7B of the light-shielding section 52GB and an end of the blue light-emitting device 10B. A distance between an end located in the red sub-pixel 7R of a light-shielding section 52RB and an end of the red light-emitting device 10R is preferably larger than a distance between an end located in the blue sub-pixel 7B of the light-shielding section 52RB and an end of the blue light-emitting device 10B. A distance between an end located in the red sub-pixel 7R of a light-shielding section 52RG and an end of the red light-emitting device 10R is preferably larger than a distance between an end located in the green sub-pixel 7G and an end of the green light-emitting device 10G. Thus, while mixing of colors from adjacent pixels is prevented, the aperture ratio is improvable.

(Modification 4)

FIGS. 13(A) and 13(B) illustrate a planar configuration and a sectional configuration of a pixel 8 of a display unit according to Modification 4, respectively. The pixel 8 is configured with use of a combination of Modification 2 and Modification 3. In other words, widths $L_R$, $L_G$, $L_B$ of light emission regions and an opening width of an opening section 62A of a light-shielding film 62 are determined for each of sub-pixels 8R, 8G, and 8B.

For example, in the case where the wavelength of light allowed to pass through a color element 63 of a sub-pixel adjacent to a certain sub-pixel (a light emission wavelength of the light-emitting device 10) is longer, color light from the adjacent sub-pixel is preferably prevented from being mixed into color light emitted from the certain sub-pixel by the light-shielding section 62B. In other words, a central position (C) of the light-shielding section 62B is located closer to the certain sub-pixel so as to prevent mixing of colors from the adjacent pixels, and opening widths in the adjacent sub-pixels are increased. More specifically, for example, a central position (C) of a light-shielding section 62RB provided between the blue sub-pixel 8B and the sub-pixel 8R adjacent to the blue sub-pixel 8B and a central position (C) of a light-shielding section 62GB provided between the blue sub-pixel 8B and the sub-pixel 8G adjacent to the blue sub-pixel 8B are located closer to a blue light-emitting device 50B. Accordingly, distances allowing light from adjacent sub-pixels (in this case, the red sub-pixel 8R and the green sub-pixel 8G) to be blocked, namely, color-mixing start angles (θ) from the adjacent pixels are increased.

Thus, when the opening width of each of the opening section 62A and the position of each of the light-shielding sections 62B in the light-shielding film 62, the position of each of color boundaries between the color elements 63, and the widths $L_R$, $L_G$, and $L_B$ of the light emission regions are determined by a relationship of colors of light emitted from the certain sub-pixel and sub-pixels adjacent to the certain sub-pixel, the color-mixing start angle is increased, and viewing angle characteristics are improved. Moreover, the aperture ratio is improvable.

3. APPLICATION EXAMPLES

The display units including the pixels 2 to 8 described in the above-described embodiments and Modifications 1 to 4 are allowed to be mounted in electronic apparatuses, in any fields, displaying an image (or a picture), as described below.

Application Example 1

FIG. 14 illustrates an appearance of a smartphone. The smartphone includes, for example, a display section 110 (the display unit 1 or the like) and a non-display section (an enclosure) 120, and an operation section 130. The operation section 130 may be disposed on a front surface of the non-display section 120, as illustrated in FIG. 14(A), or may be disposed on a top surface of the non-display section 120, as illustrated in FIG. 14(B).

Application Example 2

FIG. 15 illustrates an appearance configuration of a television. The television includes, for example, an image display screen section 200 (the display unit 1 or the like) including a front panel 210 and a filter glass 220.

Application Example 3

FIGS. 16A and 16B illustrate appearance configurations on a front side and a back side, respectively, of a digital still camera. The digital still camera includes, for example, a light-emitting section 310 for a flash, a display section 320 (the display unit 1 or the like), a menu switch 330, and a shutter button 340.

Application Example 4

FIG. 17 illustrates an appearance configuration of a notebook personal computer. The notebook personal computer includes, for example, a main body 410, a keyboard 420 for operation of inputting characters and the like, and a display section 430 (the display unit 1 or the like) for displaying an image.

Application Example 5

FIG. 18 illustrates an appearance configuration of a video camera. The video camera includes, for example, a main body 510, a lens 520 provided on a front surface of the main body 510 and for shooting an image of an object, a shooting start and stop switch 530, and a display section 540 (the display unit 1 or the like).

Application Example 6

FIGS. 19A and 19B illustrate appearance configurations of a cellular phone. FIG. 19A illustrates a front view, a left side view, a right side view, a top view, and a bottom view in a state in which the cellular phone is closed. FIG. 19B illustrates a front view and a side view in a state in which the cellular phone is opened. The cellular phone has a configuration in which, for example, a top-side enclosure 610 and a bottom-side enclosure 620 are connected together through a connection section (hinge section) 630, and the cellular phone includes a display 640 (the display unit 1 or the like), a sub-display 650, a picture light 660, and a camera 670.

4. EXAMPLES

Next, examples with use of specific values will be described below.

Example 1

FIGS. 20(A) and 20(B) illustrate an improvement in color-mixing start angle through changing a light-shielding method, which prevents color light from the blue sub-pixel 2B from being mixed into color light from the red sub-pixel 2R, from light-shielding by the light-shielding section 22B in related art (a comparative example) (refer to FIG. 20(A)) to light-shielding by the color element 23 according to the embodiment (refer to FIG. 20(B)). A distance ($L_{CF}$) between an end of the blue light-emitting device 10B and a color boundary between the color elements 23 corresponding to the blue sub-pixel 2B and the red sub-pixel 2R in FIG. 20(A), a distance ($L_{BM}$) between the end of the blue light-emitting device 10B and an end located in the red sub-pixel 2R of a light-shielding section between the blue sub-pixel 2B and the red sub-pixel 2R in FIG. 20(A), a film thickness ($D_G$) from an upper end of the blue light-emitting device 10B to a lower end of the resin layer 32, and a film thickness ($D_{CF}$) of the color element 23 were as follows.

$L_{CF}$: 0.9 micrometers
$L_{BM}$: 1.5 micrometers
$D_G$: 4 micrometers
$D_{CF}$: 2 micrometers It was found out that when the above-described values were substituted into a conditional expression, the expression (2) was satisfied; therefore, light-shielding-section light-shielding $S_{BM}$ was used. Therefore, when the distance $L_{CF}$ was changed from 0.9 micrometers to 1.4 micrometers to shift the boundary between the color elements from the central position of the light-shielding section 22B toward the red sub-pixel 2R by 0.5 micrometers, the expression (1) was satisfied. In other words, the color-element light-shielding $S_{CF}$ was used, and the color-mixing start angle was increased as illustrated in FIG. 20(B). More specifically, the color-mixing start angle was increased from 14 degrees to 19 degrees, that is, by 5 degrees.

In this case, in the red sub-pixel 2R, color mixing is prevented intrinsically by light-shielding-section light-shielding; therefore, there is any drawback caused by shifting of the position of the color boundary between the color elements 23.

Example 2

In Example 2, an experiment was executed on a basic configuration illustrated in Example 1 (Experimental Example 1) and Experimental Examples 2 to 8 in which the position of the color boundary between the color elements 23, the film thicknesses, and a backward shift amount of the light-shielding section 22B in the sub-pixels 2R, 2G, and 2B were changed from values in the basic configuration to the following values. Table 1 provides a summary of the position of the color boundary between the color elements 23, the film thickness of the color element 23, and the backward shift amount of the light-shielding section 22B. Table 2 provides a summary of variations in viewing angles of the red sub-pixel 2R, the green sub-pixel 2G, and the blue sub-pixel 2B in Experimental Examples 1 to 8. It is to be noted that, as used herein, the backward shift amount of the light-shielding section 22B refers to a shift of the central position of the light-shielding section 22 toward an adjacent pixel. Moreover, a term "+ direction" refers to tilting a viewing point to the left, and a term "− direction" refers to tilting the viewing point to the right. Values in parentheses in Experimental Examples 6 to 8 in which the light-shielding section 22B was shifted backward show suppression of variation in monochromatic chromaticity against color mixing through increasing viewing angle characteristics of a certain sub-pixel by backward shift of the light-shielding section 22B.

(Boundary Between Color Elements)

$L_{CF}$: 0.9 micrometers is changed to $L_{CF}$: 1.2 micrometers (the color boundary was shifted toward an adjacent pixel by 0.3 micrometers)

(Film Thickness of Color Element)

$D_G$: 4 micrometers is changed to $D_G$: 3.5 micrometers $D_{CF}$: 2 micrometers is changed to $D_{CF}$: 2.5 micrometers (the film thickness of the color element was increased by 0.5 micrometers)

(Backward Shift Amount of Light-Shielding Section)

$L_{BM}$: 1.2 micrometers (portions located on the red sub-pixel 2R of the light-shielding sections 22RG and 22RB, and a portion located on the blue sub-pixel 2B of the light-shielding section 22GB)

TABLE 1

| | Shift of Boundary between Color Elements | Increase in Film Thickness of Color Element | Backward Shift Amount of Light-shielding Section |
|---|---|---|---|
| Experimental Example 1 | — | — | — |
| Experimental Example 2 | B | — | — |
| Experimental Example 3 | R | — | — |
| Experimental Example 4 | G | — | — |
| Experimental Example 5 | R, G, B | — | — |
| Experimental Example 6 | R, G, B | — | 1.2 μm |
| Experimental Example 7 | R, G, B | B (+0.5 μm) | 1.2 μm |
| Experimental Example 8 | R, G, B | G, B (+0.5 μm) | 1.2 μm |

TABLE 2

| | Viewing Angle of Red Sub-pixel | | Viewing Angle of Green Sub-pixel | | Viewing Angle of Blue Sub-pixel | |
|---|---|---|---|---|---|---|
| | −Direction | +Direction | −Direction | +Direction | −Direction | +Direction |
| Experimental Example 1 | 14 | 14 | 14 | 14 | 14 | 14 |
| Experimental Example 2 | 14 | 14 | 14 | 14 | 17 | 17 |
| Experimental Example 3 | 14 | 14 | 17 | 14 | 14 | 17 |
| Experimental Example 4 | 14 | 14 | 17 | 14 | 17 | 14 |
| Experimental Example 5 | 14 | 14 | 17 | 14 | 17 | 17 |
| Experimental Example 6 | 14 (+2) | 14 (+2) | 17 | 14 (+2) | 17 | 17 |
| Experimental Example 7 | 14 (+2) | 14 (+2) | 17 | 14 (+2) | 19 | 19 |
| Experimental Example 8 | 14 (+2) | 14 (+2) | 19 | 14 (+2) | 19 | 19 |

As illustrated in Table 2, when the color boundary between the color elements 23 was determined for each of the sub-pixels 2R, 2G, and 2B, the viewing angle was increased. Moreover, it was found out that when the central position of the light-shielding section 22B was determined for each of the sub-pixels 2R, 2G, and 2B to optimize the position of the color boundary between the color elements 23 and the position of the light-shielding section 23, the viewing angle was further increased. Further, it was found out that when the film thickness of the color element 23 was adjusted, the viewing angle characteristics were improved more effectively. It was found out from Experimental Examples 6 to 8 that when the light-shielding section 22B was shifted backward, the viewing angle in the certain sub-pixel was increased while the color-mixing start angle was maintained, and variation in monochromatic chromaticity caused by color mixing was suppressed.

It is to be noted that, as the film thickness ($D_G$) of the middle layer 30 is reduced and the film thickness ($D_{CF}$) of the color element 23 is increased, the color-mixing start angle in the configuration described in the above-described embodiment or the like is further increased. For example, in a display unit with an on-chip color filter (OCCF) configuration in which the first substrate 11 is directly coated with color elements (color filters), such a tendency is pronounced.

Although the present disclosure is described referring to some embodiments and Modifications 1 to 4, the disclosure is not limited thereto, and may be variously modified. For example, the material and thickness of each layer, the method and conditions of forming each layer are not limited to those described in the above-described embodiments and the like, and each layer may be made of any other material with any other thickness by any other method under any other conditions.

Moreover, it is not necessary to include all of the layers described in the above-described embodiment and the like, and any of the layers may be removed as appropriate. Further, a layer other than the layers described in the above-described embodiments and the like may be further included. For example, one or more layers made of a material having hole transport performance such as a common hole transport layer described in Japanese Unexamined Patent Application Publication No. 2011-233855 may be further included between the electron transport layer 16D and the light-emitting layer 16C of the blue light-emitting device 10B. When such a layer is further included, light emission efficiency and life characteristics of the blue light-emitting device 10B are improved.

It is to be noted that the technology is allowed to have the following configurations.

(1) A display unit including:

a first substrate on which light-emitting devices of different colors are formed corresponding to respective pixels, each of the light-emitting devices including at least a light-emitting layer; and a second substrate disposed to face the first substrate, in which the second substrate includes a light-shielding film and color elements of a plurality of colors, the light-shielding film including opening sections in positions corresponding to the respective light-emitting devices and light-shielding sections between two adjacent ones of the opening sections, and a central position of each of the light-shielding sections in a display plane direction and a position of a color boundary between two adjacent ones of the color elements do not coincide with each other.

(2) The display unit according to (1), in which the central position of each of the light-shielding sections is varied with pixels adjacent to the light-shielding section.

(3) The display unit according to (1) or (2), in which widths of the color elements are varied with the pixels.

(4) The display unit according to any one of (1) to (3), in which a color boundary between two adjacent ones of the color elements does not coincide with a center of a distance between light emission ends of two adjacent ones of the light-emitting devices.

(5) The display unit according to any one of (1) to (4), in which a color boundary between two adjacent ones of the color elements corresponding to two adjacent ones of the pixels is located closer to a pixel emitting light with a longer wavelength of the two adjacent pixels.

(6) The display unit according to (5), in which the pixels include red pixels, green pixels, and blue pixels, and a color boundary between two adjacent ones corresponding to the green pixel and the blue pixel of the color elements is located closer to the green pixel.

(7) The display unit according to (6), in which a color boundary between two adjacent ones corresponding to the red pixel and the blue pixel of the color elements is located closer to the red pixel.

(8) The display unit according to (6), in which a color boundary between two adjacent ones corresponding to the red pixel and the green pixel of the color elements is located closer to the red pixel.

(9) The display unit according to any one of (1) to (8), in which the pixels include white pixels and monochromatic pixels other than the white pixels, and a color boundary between two adjacent ones corresponding to the white pixel and the monochromatic pixel of the color elements is located closer to the white pixel.

(10) The display unit according to any one of (1) to (9), in which a film thickness of each of the color elements is varied with the colors.

(11) An electronic apparatus provided with a display unit, the display unit including:

a first substrate on which light-emitting devices of different colors are formed corresponding to respective pixels, each of the light-emitting devices including at least a light-emitting layer; and a second substrate disposed to face the first substrate, in which the second substrate includes a light-shielding film and color elements of a plurality of colors, the light-shielding film including opening sections in positions corresponding to the respective light-emitting devices and light-shielding sections between two adjacent ones of the opening sections, and a central position of each of the light-shielding sections in a display plane direction and a position of a color boundary between two adjacent ones of the color elements do not coincide with each other.

It is to be noted that the technology is also allowed to have the following configurations.

(1) A display unit comprising:

a light emitting layer including a light emitting device;

a color filter layer including a color filter corresponding to the light emitting device; and a light blocking layer including a light blocking member arranged to overlap an end of the color filter, a center position of the light blocking member being offset from the end of the color filter.

(2) The display unit according to (1), wherein the center position of the light blocking member is offset from the end of the color filter by an amount such that a line connecting an end of the light emitting device to a same side end of the light blocking member intersects the color filter.

(3) The display unit according to (1), wherein the light emitting layer includes a plurality of light emitting devices, and the color filter layer includes a plurality of color filters corresponding to the light emitting devices, and the light blocking member is arranged to overlap a boundary between ends of two adjacent color filters.

(4) The display unit according to (3), wherein in a first color filter more than half of the light blocking member overlaps said first color filter, and in a second color filter that is adjacent to the first color filter less than half of the same light blocking member overlaps said second color filter.

(5) The display unit according to (4), wherein in a first color filter is a different color type than the second color filter.

(6) The display unit according to (3), wherein the light blocking layer includes a plurality of light blocking members, each light blocking member overlapping a different boundary between end of adjacent color filters.

(7) The display unit according to (6), wherein the color filter layer includes a plurality of different types of color filters alternately arranged, and the central positions of the respective light blocking members relative to the boundaries between ends of adjacent color filters are based on adjacent color filter type combinations.

(8) The display unit according to (6), further comprising sub-pixels each including portions of the light blocking layer, the light emitting layer and the color filter layer, wherein the color filter layer includes a plurality of different types of color filters alternately arranged and that correspond to different types of the sub-pixels, and wherein in a case where a wavelength of light allowed to pass through a first type of color filter of a first sub-pixel is shorter than a wavelength of light allowed to pass through a second type of color filter of an adjacent second sub-pixel, light emitted from the light emitting layer of the first sub-pixel is blocked by the end of the second color filter to prevent mixing of colors from the first sub-pixel.

(9) The display unit according to (1), further comprising sub-pixels each including portions of the light blocking layer, the light emitting layer and the color filter layer, wherein the color filter layer includes a plurality of different types of color filters alternately arranged and that correspond to different types of the sub-pixels, and wherein in the case where a wavelength of light allowed to pass through a first type of color filter of a first sub-pixel is longer than a wavelength of light allowed to pass through a second type of color filter of an adjacent second sub-pixel, light from the first sub-pixel is blocked by a light blocking member that overlaps the boundary between ends of the first and second sub-pixels to prevent mixing of colors from the adjacent second sub-pixel.

(10) The display unit according to (7), wherein film thicknesses of the color filters differ based on the type of the color filter.

(11) The display unit according to (4), wherein the light emitting layer includes a plurality of different types of light emitting devices, and widths of light emission regions of the light emitting devices vary with the type of light emitting device.

(12) The display unit according to (6), further comprising sub-pixels each including portions of the light blocking layer, the light emitting layer and the color filter layer, wherein a horizontal distance between an outer end of a light emitting device and an inner end of a light blocking member on a same side of a first color type of sub-pixel is different than an outer end of a light emitting device and an inner end of a light blocking member on a same side a second color type of subpixel.

(13) The display unit according to (12), wherein the sub-pixels include a red type sub-pixel, a green type sub-pixel, and a blue type sub-pixel, and the horizontal distance in the green type sub-pixel is greater than the horizontal distance in the blue type sub-pixel.

(14) An electronic apparatus comprising:

a processor; and a display unit operable with the processor to display an image, the display unit including:

a light emitting layer including a light emitting device, a color filter layer including a color filter corresponding to the light emitting device, and a light blocking layer including a light blocking member arranged to overlap a side face of the color filter, a center position of the light blocking member being offset from and end of the color filter.

The present disclosure contains subject matter related to that disclosed in Japanese Priority Patent Application No.

2012-211861 filed in the Japan Patent Office on Sep. 26, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A display unit comprising:
a light emitting layer including a light emitting device;
a color filter layer including a color filter corresponding to the light emitting device; and
endmost side surfaces of adjacent two color filters contact one another and make a color filter boundary, and
adjacent two light emitting device make a light emitting device boundary,
wherein the color filter boundary is arranged at a different position from the corresponding to the light emitting device boundary in plain view.

2. The display unit according to claim 1,
wherein a first color filter is a different color than a second color filter.

3. The display unit according to claim 2,
wherein an area of the first color filter is larger than an area of the second color filter.

4. The display unit according to claim 3,
wherein the first color filter is a blue color filter.

5. The display unit according to claim 1,
wherein the light emitting layer includes a plurality of light emitting devices,
and the color filter layer includes a plurality of color filters corresponding to the light emitting devices,
and a light blocking member is arranged between the color filters.

6. The display unit according to claim 5,
wherein the light blocking member is arranged to overlap a boundary between ends of two adjacent color filters.

7. The display unit according to claim 6,
wherein in a first color filter more than half of the light blocking member overlaps said first color filter, and in a second color filter that is adjacent to the first color filter less than half of the same light blocking member overlaps said second color filter.

8. The display unit according to claim 5,
wherein the light blocking layer includes a plurality of light blocking members, each light blocking member overlapping a different boundary between end of adjacent color filters.

9. The display unit according to claim 8,
wherein the color filter layer includes a plurality of different types of color filters alternately arranged, and the central positions of the respective light blocking members relative to the boundaries between ends of adjacent color filters are based on adjacent color filter type combinations.

* * * * *